US010522560B2

(12) United States Patent
Lee

(10) Patent No.: US 10,522,560 B2
(45) Date of Patent: Dec. 31, 2019

(54) SEMICONDUCTOR DEVICE HAVING A SOURCE LINE

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-Do (KR)

( * ) Notice: Subject to any disclaimer, the term of this patent is extended or adjusted under 35 U.S.C. 154(b) by 0 days.

(21) Appl. No.: 15/927,802

(22) Filed: Mar. 21, 2018

(65) Prior Publication Data

US 2019/0081065 A1    Mar. 14, 2019

(30) Foreign Application Priority Data

Sep. 11, 2017   (KR) .................. 10-2017-0115979

(51) Int. Cl.
*H01L 27/11582* (2017.01)
*H01L 27/11565* (2017.01)
*H01L 27/11568* (2017.01)
*H01L 27/11573* (2017.01)
*H01L 29/51* (2006.01)
(Continued)

(52) U.S. Cl.
CPC ...... *H01L 27/11582* (2013.01); *H01L 21/768* (2013.01); *H01L 23/535* (2013.01); *H01L 27/11565* (2013.01); *H01L 27/11568* (2013.01); *H01L 27/11573* (2013.01); *H01L 29/40117* (2019.08); *H01L 29/42348* (2013.01); *H01L 29/513* (2013.01)

(58) Field of Classification Search
CPC ......... H01L 27/11582; H01L 27/11568; H01L 27/1157; H01L 27/11556; H01L 27/11524; H01L 27/11575; H01L 27/11529; H01L 21/76877; H01L 21/28282; H01L 29/42348; H01L 29/7926
See application file for complete search history.

(56) References Cited

U.S. PATENT DOCUMENTS 8,178,919 B2 * 5/2012 Fujiwara ........... H01L 27/11524
257/319
2009/0108318 A1 * 4/2009 Yoon .................. H01L 21/8221
257/306
(Continued)

FOREIGN PATENT DOCUMENTS

KR   1020170036877 A   4/2017

*Primary Examiner* — Khiem D Nguyen
(74) *Attorney, Agent, or Firm* — William Park & Associates Ltd.

(57) ABSTRACT

A semiconductor device and a method of manufacturing a semiconductor device may be provided. The semiconductor device may include a source line formed over a substrate. The semiconductor device may include a channel pattern including a connection part disposed over the source line, and pillar parts protruding from the connection part in a first direction. The semiconductor device may include a well structure protruding from the connection part in the first direction and spaced apart from the source line. The semiconductor device may include a source contact structure protruding from the source line in the first direction and passing through the connection part. The semiconductor device may include a gate stack disposed between the source contact structure and the well structure and enclosing the pillar parts over the connection part.

20 Claims, 22 Drawing Sheets

(51) Int. Cl.
*H01L 21/768* (2006.01)
*H01L 23/535* (2006.01)
*H01L 29/423* (2006.01)
*H01L 21/28* (2006.01)

(56) References Cited

U.S. PATENT DOCUMENTS

| | | | |
|---|---|---|---|
| 2010/0244119 A1* | 9/2010 | Fukuzumi | H01L 27/11578 257/324 |
| 2012/0003831 A1* | 1/2012 | Kang | H01L 27/11551 438/639 |
| 2013/0009235 A1* | 1/2013 | Yoo | H01L 29/7926 257/329 |
| 2013/0320424 A1* | 12/2013 | Lee | H01L 27/1158 257/314 |
| 2016/0276360 A1 | 9/2016 | Doda et al. | |
| 2017/0062463 A1* | 3/2017 | Shin | H01L 27/11565 |
| 2017/0162594 A1* | 6/2017 | Ahn | H01L 21/31 |

* cited by examiner

SEMICONDUCTOR DEVICE HAVING A SOURCE LINE

CROSS-REFERENCE TO RELATED APPLICATION

The present application claims priority under 35 U.S.C. § 119(a) to Korean patent application number 10-2017-0115979 filed on Sep. 11, 2017, in the Korean Intellectual Property Office, the entire disclosure of which is incorporated herein by reference.

BACKGROUND

1. Technical Field

Various embodiments of the present disclosure may generally relate to a semiconductor device and a method of manufacturing the same, and more particularly, to a three-dimensional semiconductor memory device and a method of manufacturing the same.

2. Related Art

A semiconductor device includes a plurality of memory cell transistors capable of storing data. The memory cell transistors may be coupled in series between select transistors, thus forming a memory string. A three-dimensional semiconductor device may be embodied by stacking gates of the memory cell transistors and the select transistors on a substrate.

SUMMARY

In an embodiment of the present disclosure, a semiconductor device may be provided. The semiconductor device may include a source line formed over a substrate. The semiconductor device may include a channel pattern including a connection part disposed over the source line, and pillar parts protruding from the connection part in a first direction. The semiconductor device may include a well structure protruding from the connection part in the first direction and spaced apart from the source line. The semiconductor device may include a source contact structure protruding from the source line in the first direction and passing through the connection part. The semiconductor device may include a gate stack disposed between the source contact structure and the well structure and enclosing the pillar parts over the connection part.

In an embodiment of the present disclosure, a semiconductor device may be provided. The semiconductor device may include gate stacks disposed over a source line. The semiconductor device may include a source contact structure disposed between the gate stacks and protruding toward the source line further than the gate stacks so that the source contact structure is coupled to the source line. The semiconductor device may include insulating spacers disposed between the gate stacks and the source contact structure. The semiconductor device may include horizontal extension parts protruding from a sidewall of a lower end of the source contact structure that is adjacent to the source line and overlapping the insulating spacers.

In an embodiment of the present disclosure, a method of manufacturing a semiconductor device may be provided. The method may include forming a stack enclosing a channel layer and disposed over a source line, the channel layer including a connection part disposed over the source line and pillar parts extending from the connection part in a first direction, the stack enclosing the pillar parts of the channel layer over the connection part of the channel layer. The method may include forming a first opening and a second opening passing through the stack to divide the stack into gate stacks and expose the connection part. The method may include forming a well doping layer extending along a surface of the first opening and a surface of the second opening. The method may include removing a portion of the well doping layer from the second opening to expose the second opening. The method may include forming a source trench extending from the second opening to expose the source line. The method may include forming a source contact layer which fills the source trench and the second opening.

In an embodiment of the present disclosure, a method of manufacturing a semiconductor device may be provided. The method may include forming a source line. The method may include forming a channel layer including, a connection part extending parallel to the source line, and pillar parts protruding from the connection part in a first direction. The method may include forming gate stacks enclosing the pillar parts and disposed over the connection part. The method may include forming insulating spacers on sidewalls of the gate stacks. The method may include forming a source contact structure including horizontal extension parts protruding to overlap the insulating spacers, the source contact structure being disposed between the gate stacks and passing through the connection part so that the source contact structure is coupled to the source line.

DETAILED DESCRIPTION

Figure 1:
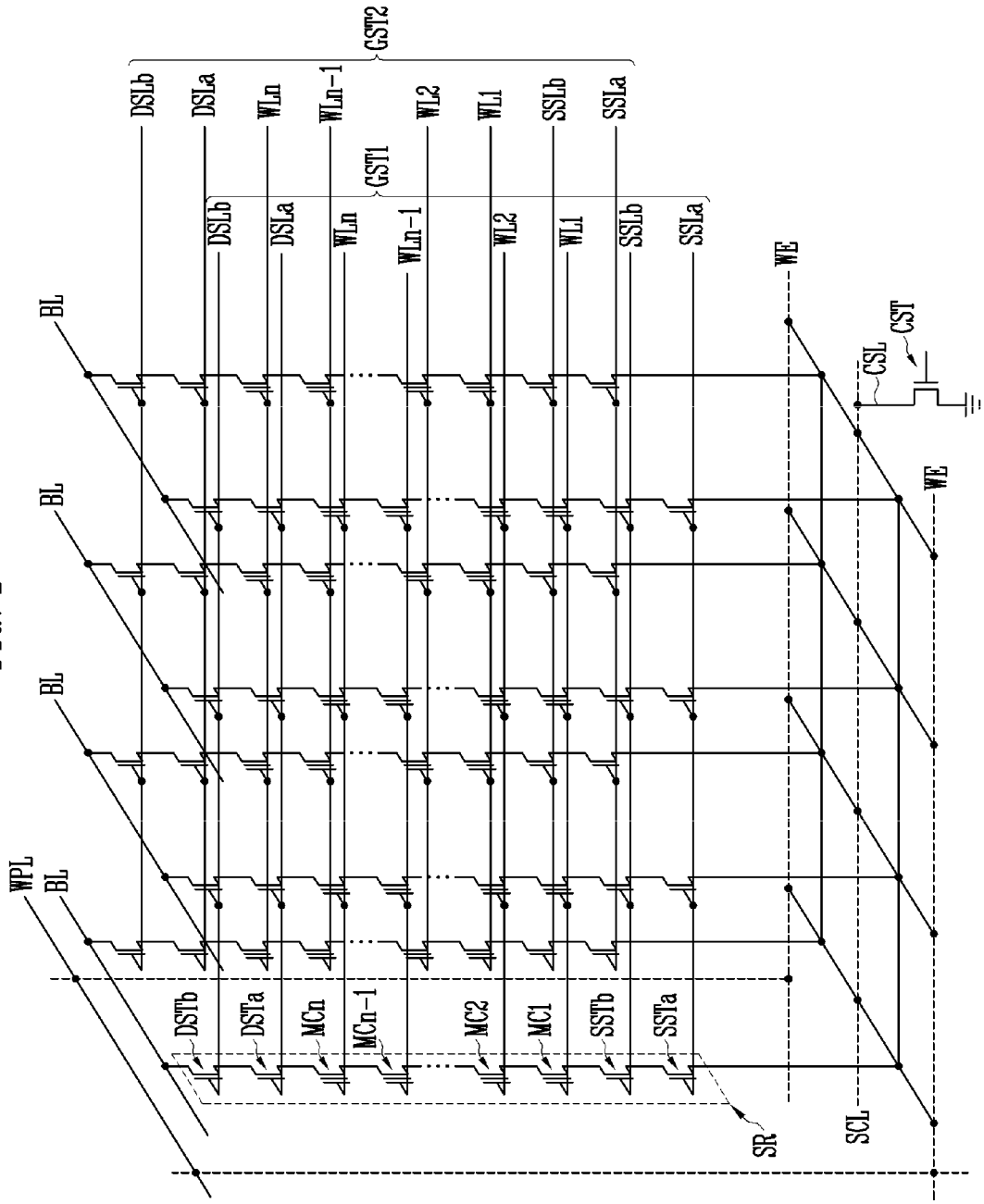
FIG. 1 shows a schematic circuit diagram of a semiconductor device in accordance with an embodiment of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure aids in a description of the present teachings, and conveys a description to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly connecting another component but also indirectly connecting to another component through an intermediate component. On the other hand, "directly connected/directly coupled" refers to one component directly connecting to another component without an intermediate component.

Embodiments of the present disclosure provide a three-dimensional semiconductor device having improved operational reliability, and a method of manufacturing the same.

FIG. 1 shows a schematic circuit diagram of a semiconductor device in accordance with an embodiment of the present disclosure.

Referring to FIG. 1, the semiconductor device in accordance with an embodiment may include a plurality of memory strings SR coupled between bit lines BL and a source line CSL.

The memory strings SR may be arranged in a zigzag manner to improve a degree of integration of the semiconductor device. The arrangement of the memory strings SR may be defined by an arrangement of pillar parts of a channel pattern. The arrangement of the pillar parts of the channel pattern will be described later herein with reference to FIG. 2A.

Each of the memory strings SR may include a source select transistor SSTa or SSTb, a plurality of memory cell transistors MC1 to MCn (n is a natural number of 2 or more), and a drain select transistor DSTa or DSTb that are coupled in series to each other by a pillar part of the channel pattern. Each of the memory strings SR may include a single drain select transistor DSTa or two or more drain select transistors DSTa and DSTb coupled in series to each other. Each of the memory strings SR may include a single source select transistor SSTa or two or more source select transistors SSTa and SSTb coupled in series to each other.

The memory strings SR may be coupled to gate stacks GST1 and GST2. Although FIG. 1 illustrates a first gate stack GST1 and a second gate stack GST2, the number of gate stacks is not limited thereto.

Each of the gate stacks GST1 and GST2 may include a source select line SSLa or SSLb, word lines WL1 to WLn, and a drain select line DSLa or DSLb. Each of the gate stacks GST1 and GST2 may include a single source select line SSLa disposed under the word lines WL1 to WLn, or two or more source select lines SSLa and SSLb spaced apart from each other and disposed under the word lines WL1 to WLn. Each of the gate stacks GST1 and GST2 may include a single drain select line DSLa disposed over the word lines WL1 to WLn, or two or more drain select lines DSLa and DSLb spaced apart from each other and disposed over the word lines WL1 to WLn.

The word lines WL1 to WLn are coupled to gates of the memory cell transistors MC1 to MCn. The source select lines SSLa and SSLb are coupled to gates of the source select transistors SSTa and SSTb. The drain select lines DSLa and DSLb are coupled to gates of the drain select transistors DSTa and DSTb. The drain select lines DSLa and DSLb control electrical connection between the memory strings SR and the bit lines BL. The source select lines SSLa and SSLb control an electrical connection between the memory strings SR and the source line CSL.

The source line CSL may be coupled to the memory strings SR via a source contact structure SCL. The memory strings SR may be coupled to a well pick-up line WPL via a well structure WE. The well structure WE may be disposed on one side of each of the gate stacks GST1 and GST2, and a source contact structure SCL may be disposed on the other side thereof. In other words, each of the gate stacks GST1 and GST2 may be disposed between the well structure WE and the source contact structure SCL disposed adjacent to the well structure WE.

Figure 3A:
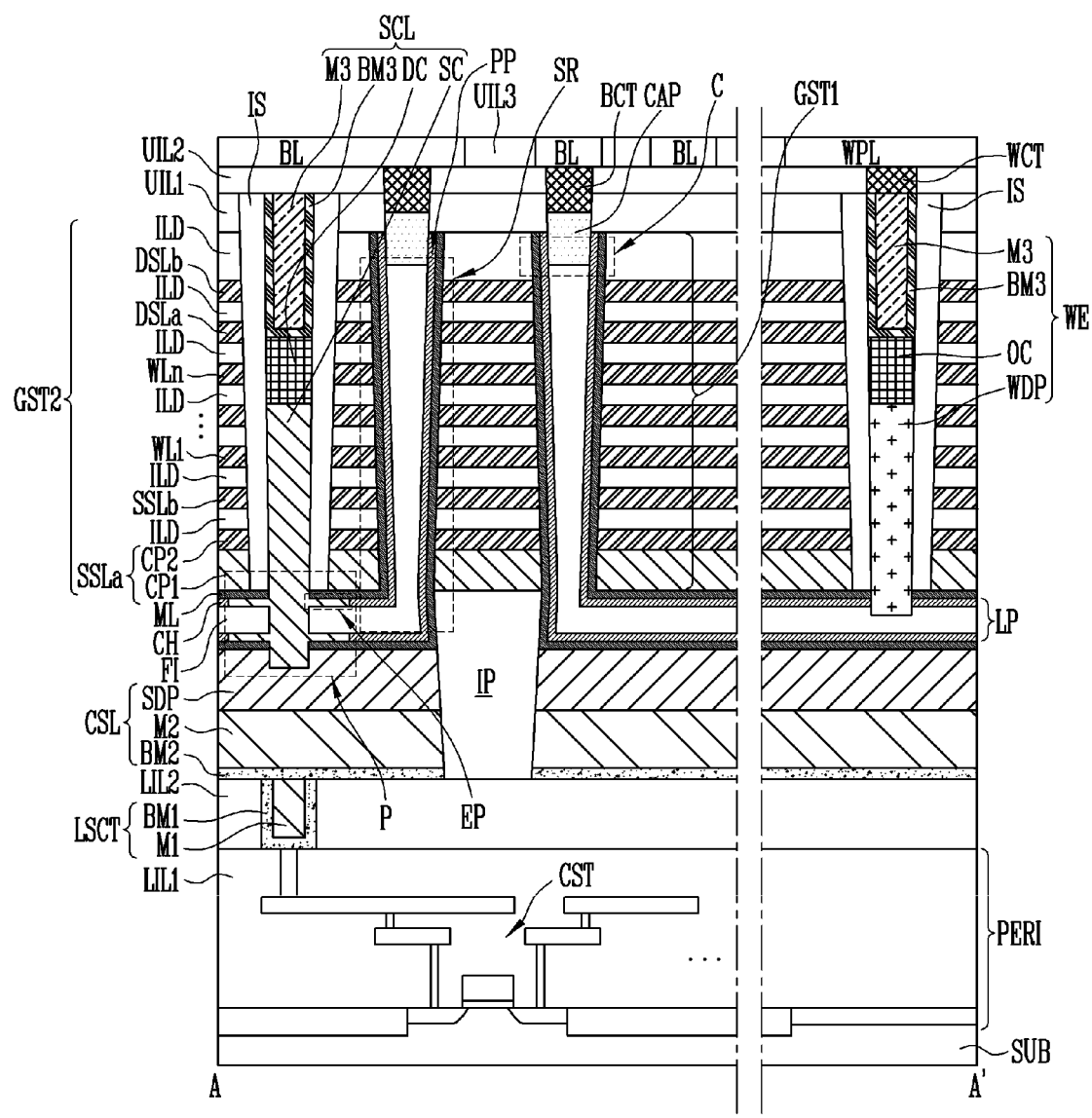
FIGS. 3A and 3B show sectional views illustrating a semiconductor device in accordance with an embodiment of the present disclosure.
Figure 3B:
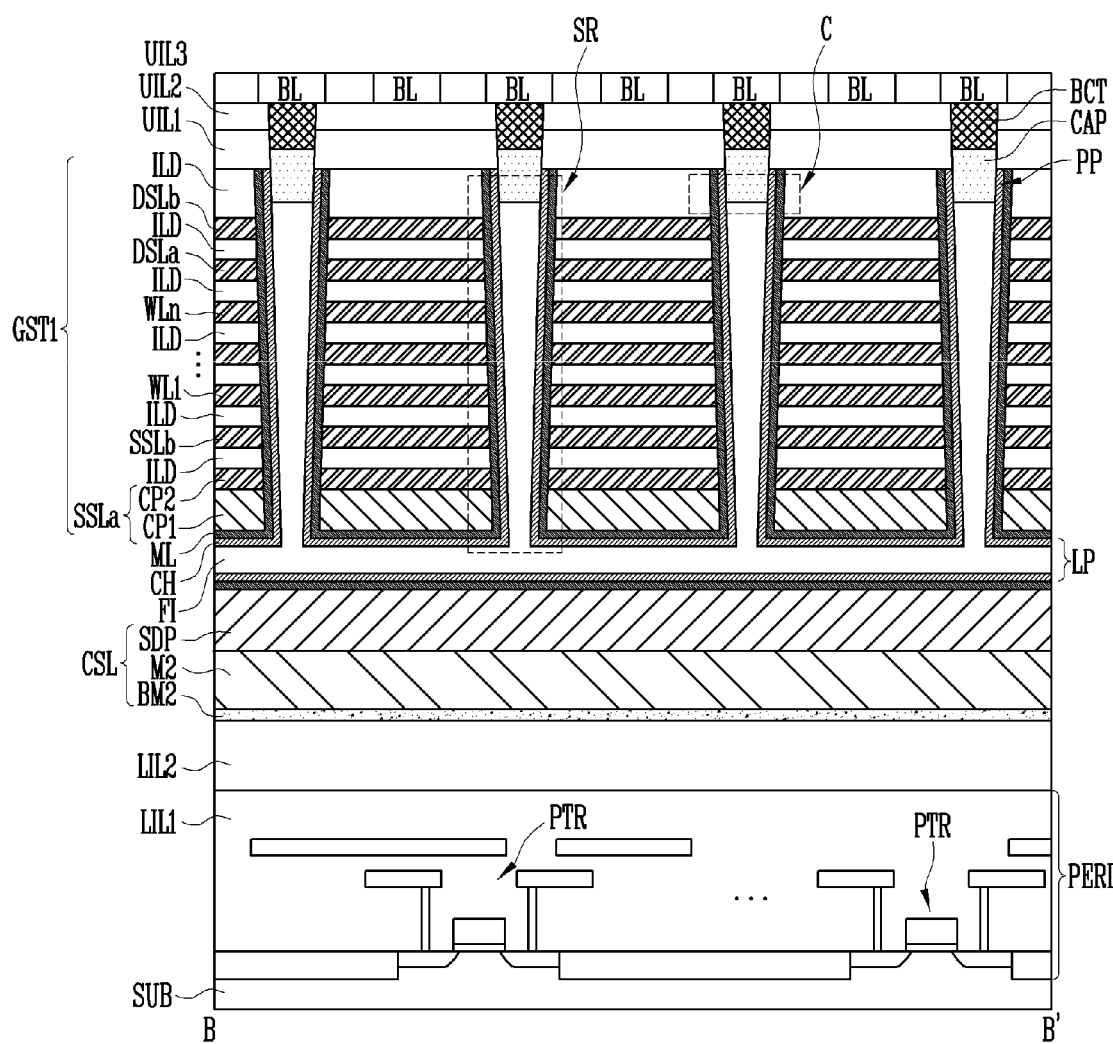
Figure 4:
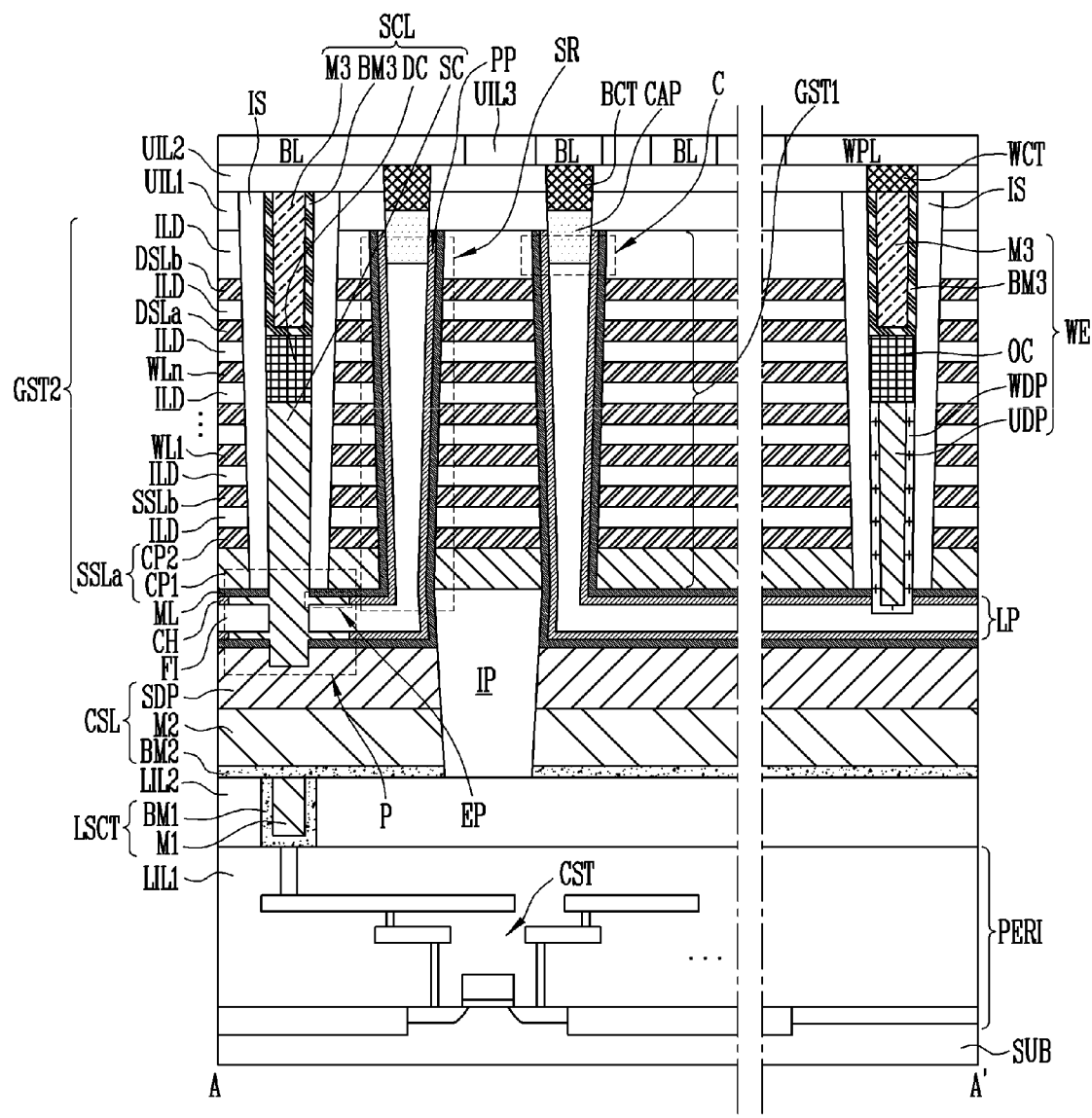
FIG. 4 shows a sectional view illustrating a semiconductor device in accordance with an embodiment of the present disclosure.

The source line CSL is coupled to a discharge transistor CST. The discharge transistor CST may include a gate terminal, a source terminal, and a drain terminal. The discharge transistor CST may be disposed between the source line CSL and a substrate SUB as shown in FIG. 3B or 4. One of the source terminal and the drain terminal of the discharge transistor CST is coupled to the source line CSL, and the other is coupled to the ground. The discharge transistor CST may couple the source line CSL to the ground in response to a signal applied to the gate terminal. In other words, the discharge transistor CST may determine whether to discharge the voltage of the source line CSL.

According to the above-described circuit, each of the memory strings SR in accordance with an embodiment may include a first terminal coupled to the well structure WE, a second terminal coupled to the source line CSL, a third terminal coupled to each of the word lines WL1 to WLn, and a fourth terminal coupled to the bit line BL. Particularly, in an embodiment of the present disclosure, because the first terminal coupled to the well structure WE is separated from the second terminal coupled to the source line CSL, an operation of controlling an erase operation through the well structure WE, and an operation of controlling a read operation or a program operation through the source line CSL may be individually performed. Thereby, the operational reliability of the semiconductor device in accordance with an embodiment of the present disclosure may be enhanced.

Figure 2A:
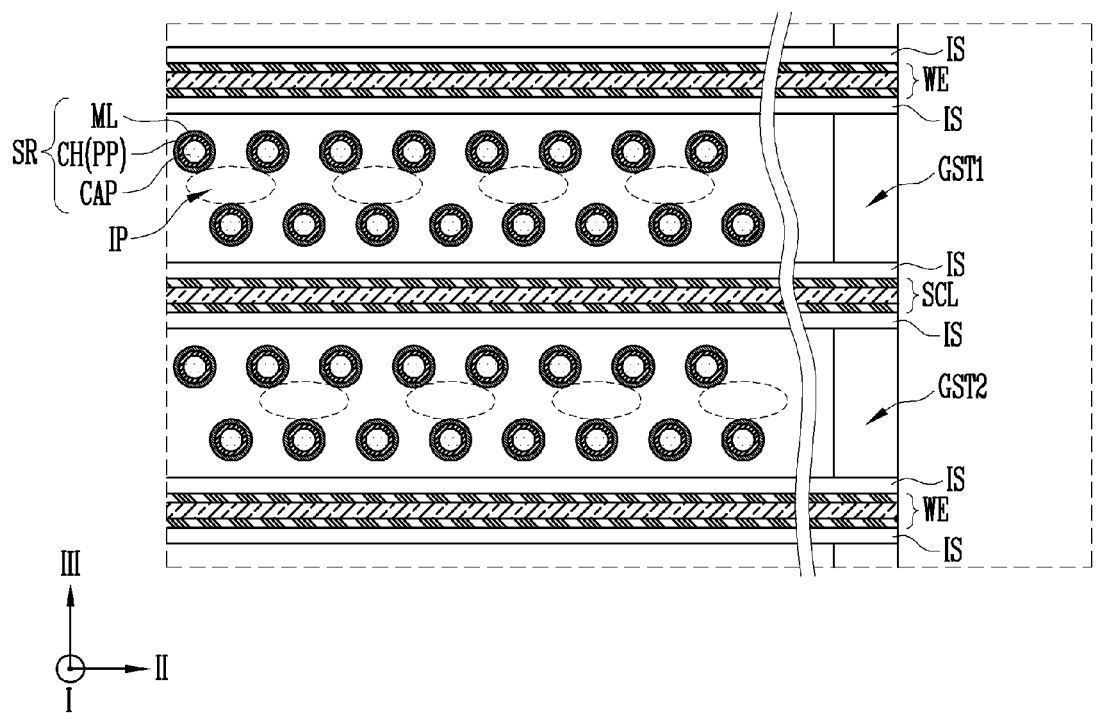
FIGS. 2A and 2B show plan views illustrating a semiconductor device in accordance with an embodiment of the present disclosure.
Figure 2B:
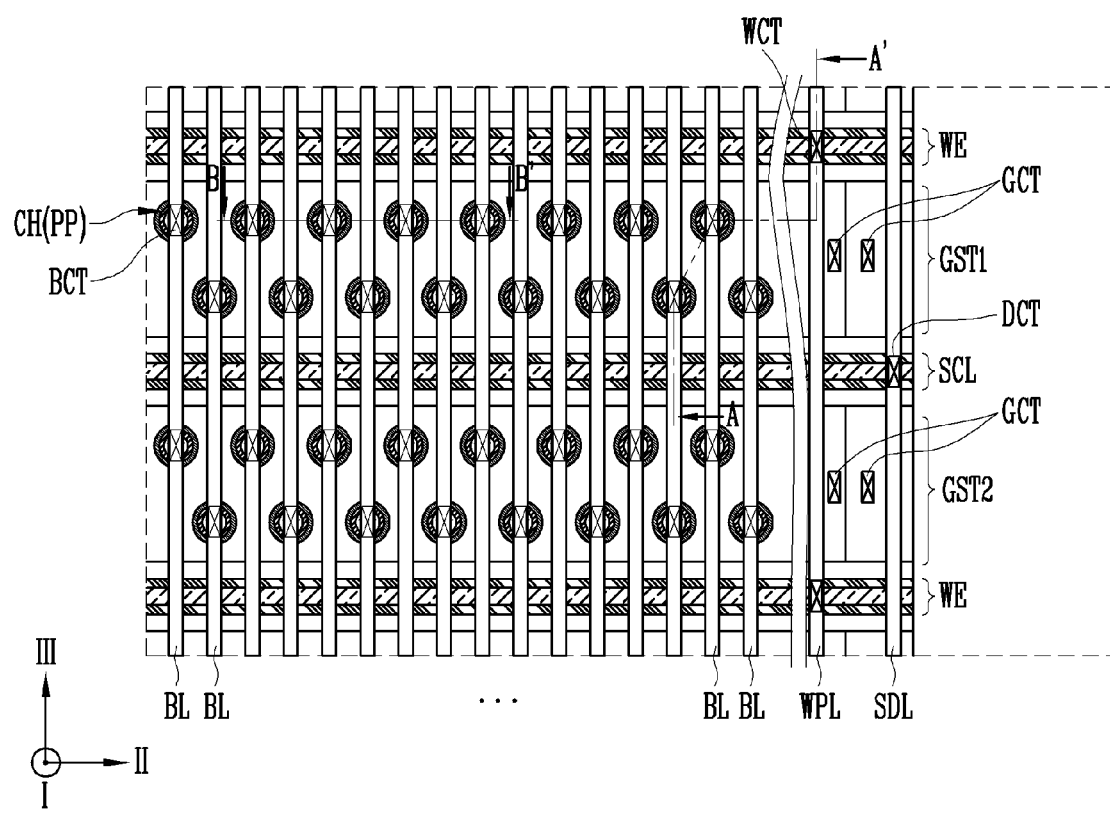

FIGS. 2A and 2B are plan views illustrating a semiconductor device that forms the circuit shown in FIG. 1. FIGS. 2A and 2B illustrate only one side of the gate stacks.

FIG. 2A shows a plan view illustrating the structure disposed below upper lines.

Referring to FIG. 2A, each of the gate stacks GST1 and GST2 is disposed between the source contact structure SCL and the corresponding well structure WE that are adjacent to each other. Each of the gate stacks GST1 and GST2 encloses the corresponding pillar parts PP of the channel pattern CH. In other words, the pillar parts PP of the channel pattern CH pass through the gate stacks GST1 and GST2. Hereinafter, a direction in which the pillar parts PP extend is defined as a first direction I.

The gate stacks GST1 and GST2 may include a stepwise contact area. The gate stacks GST1 and GST2 may form memory blocks. The gate stacks GST1 and GST2 may extend in a second direction II and a third direction III. The second direction II and the third direction III intersect with each other. The second direction II and third direction III perpendicularly intersect with the first direction I. The source contact structure SCL and the well structure WE extend parallel to each other in the second direction II. One of the gate stacks GST1 and GST2 may be disposed between the source contact structure SCL and the well structure WE that are adjacent to each other in the third direction III. Source contact structures SCL and well structures WE may be alternately arranged in the third direction III. The well structure WE faces the source contact structure SCL with the gate stack GST1 or GST2 interposed between the well structure WE and the source contact structure SCL. Although FIG. 2A illustrates a case where the source contact structure SCL and the well structure WE extend in a line shape in the second direction II, the present disclosure is not limited thereto. For example, each of the source contact structure SCL and the well structure WE may be divided into a plurality of plug patterns spaced apart from each other in the second direction II.

Insulating spacers IS may be formed along sidewalls of the gate stacks GST1 and GST2. The insulating spacers IS may be disposed between the well structure WE and the gate stacks GST1 and GST2 and between the source contact structure SCL and the gate stacks GST1 and GST2 so that the gate stacks GST may be insulated from the well structure WE and the source contact structure SCL. The source contact structure SCL is coupled to the source line CSL disposed below the gate stacks GST1 and GST2. The connection relationship between the source line CSL and the source contact structure SCL is illustrated in FIG. 3A or 4.

The memory strings SR are defined along the pillar parts PP of the channel pattern CH. The pillar parts PP may be arranged in a zigzag manner. Each of the memory strings SR further includes a multilayer memory layer ML. The multilayer memory layer ML may extend along an outer surface of the channel pattern CH. In one example, the multilayer memory layer ML may extend from a space between the channel patterns CH and the gate stack GST1 and GST2 into a space between the channel patterns CH and the source line CSL. The channel pattern CH further includes a connection part coupled to the pillar parts PP. The connection part is disposed between the source line and the gate stacks GST1 and GST2. The structure of the connection part of the channel pattern CH is illustrated in FIGS. 3A to 4.

The gate stacks GST1 and GST2 may be supported by supports IP disposed under the gate stacks GST1 and GST2. The supports IP may be disposed not to overlap the pillar parts PP, or only parts of the pillar parts PP may overlap the support parts IP.

Each of the pillar parts PP of the channel pattern CH may be formed to enclose a corresponding capping pattern CAP. The capping pattern CAP may be electrically coupled to the channel pattern CH to transmit a signal from the bit line to the channel pattern CH.

FIG. 2B shows a plan view illustrating a layout of the upper lines.

Referring to FIG. 2B, the upper lines may include the bit lines BL coupled to the pillar parts PP of the channel pattern CH, and the well pick-up line WPL coupled to the well structure WE. The upper lines may further include a source dummy line SDL coupled to the source contact structure SCL. The upper lines BL, WPL, and SDL, are disposed over the gate stacks GST1 and GST2.

The bit lines BL may be electrically coupled to the pillar parts PP through bit line contact plugs BCT. Each of the bit line contact plugs BCT may come into contact with at least one of the corresponding pillar part PP and the associated capping pattern CAP shown in FIG. 2A and extend toward the corresponding bit line BL. Although not shown, the bit lines BL may be coupled to a peripheral circuit to transmit a driving voltage to the pillar parts PP.

The well pick-up line WPL may be electrically coupled to the well structure WE through a well contact plug WCT. The well pick-up line WPL may be coupled to the peripheral circuit to supply a well voltage to the well structure WE.

The source dummy line SDL may be electrically coupled to the source contact structure SCL through the dummy contact plug DCT. The source dummy line SDL may be formed of a low-resistance metal layer so that the resistance of the source line that is coupled to the source contact structure SCL may be reduced. The source dummy line SDL may be formed of low-resistance metal such as tungsten or aluminum. The source dummy line SDL may be formed of the same material as the bit lines BL and disposed on the same layer as the bit lines BL. The source dummy line SDL may be omitted as needed. If the source dummy line SDL is omitted, a margin in the arrangement of the upper lines may be increased.

The gate stacks GST1 and GST2 may be coupled to the gate contact plugs GCT. The gate contact plugs GCT may be respectively coupled to gate electrodes that are exposed through stepwise structures of the gate stacks GST1 and GST2, and may extend in the first direction I.

FIGS. 3A and 3B show sectional views illustrating a semiconductor device in accordance with an embodiment of the present disclosure. FIG. 4 shows a sectional view illustrating a semiconductor device in accordance with an embodiment of the present disclosure. In more detail, FIG. 3A shows a sectional view taken along line A-A' shown in FIG. 2B. FIG. 3B shows a sectional view taken along line B-B' shown in FIG. 2B. FIG. 4 shows a sectional view taken along line A-A' of FIG. 2B to illustrate a modification of the well structure.

Referring to FIGS. 3A to 4, the source line CSL may be disposed over a substrate SUB including a peripheral circuit PERI. The peripheral circuit PERI includes driving transistors CST and PTR configured to control the operation of the memory string SR. The driving transistors CST and PTR may include a discharge transistor CST configured to couple the source line CSL to the ground.

The driving transistors CST and PTR of the peripheral circuit PERI may be arranged to have various structures and be coupled to the memory string SR through contact plugs and routing lines having various layouts.

The peripheral circuit PERI, and the contact plugs and the routing lines that are coupled to the peripheral circuit PERI may be covered with a first lower insulating layer LIL1. The first lower insulating layer LIL1 may be formed of multiple insulating layers.

A second lower insulating layer LIL2 penetrated by a lower source contact plug LSCT may be provided on the first lower insulating layer LIL1. The lower source contact plug LSCT may include a metal layer M1. The lower source contact plug LSCT may further include a barrier metal layer BM1. The barrier metal layer BM1 of the lower source contact plug LSCT may be disposed between the metal layer M1 and the second lower insulating layer LIL2 to prevent the metal layer M1 and the second lower insulating layer LIL2 from coming into direct contact with each other.

The lower source contact plug LSCT may be coupled to any one of a source terminal and a drain terminal of the discharge transistor CST. The lower source contact plug LSCT may be coupled to the discharge transistor CST via the contact plugs and the routing lines that are formed in the first lower insulating layer LIL1.

The source line CSL is coupled to the lower source contact plug LSCT and formed on the second lower insulating layer LIL2. The source line CSL may include a first conductivity type dopant. The first conductivity type dopant may be an n-type dopant. In detail, the source line CSL may include a source doping semiconductor layer SDP including a first conductivity type dopant. The source doping semiconductor layer SDP may be an n-type doped silicon layer. The source line CSL may further include a metal layer M2. The metal layer M2 of the source line CSL may be disposed under the source doping semiconductor layer SDP, and may reduce the resistance of the source doping semiconductor layer SDP. The source line CSL may further include a barrier metal layer BM2 disposed between the metal layer M2 and the second lower insulating layer LIL2. The barrier metal layer BM2 of the source line CSL may prevent the metal layer M2 and the second lower insulating layer LIL2 from coming into direct contact with each other.

The source line CSL may be penetrated by the supports IP configured to support the gate stacks GST1 and GST2. The supports IP may protrude further than the source line CSL in the first direction that is the upward direction. The gate stacks GST1 and GST2 may be disposed over the source line CSL at positions spaced apart from the source line CSL.

The channel pattern CH extends along the space between the source line CSL and the gate stacks GST1 and GST2, and protrudes in the first direction I to pass through the gate stacks GST1 and GST2. In more detail, the channel pattern CH may include a connection part LP and pillar parts PP. The connection part LP and the pillar parts PP form the integrated channel pattern CH without having an interface therebetween. The channel pattern CH including the connection part LP may be disposed over the source line CSL.

The connection part LP is disposed on the source line CSL. The pillar parts PP protrude from the connection part LP in the first direction and pass through the gate stacks GST1 and GST2. The pillar parts PP are parts enclosed by the gate stacks GST1 and GST2, and extend along inner surfaces of holes passing through the gate stacks GST1 and GST2. The connection part LP is disposed in the space between the source line CSL and the gate stacks GST1 and GST2, and encloses the supports IP. The connection part LP couples the pillar parts PP with each other. The connection part LP extends along the bottom of each of the gate stacks GST1 and GST2, the sidewalls of the supports IP, and an upper surface of the source line CSL.

The channel pattern CH may be enclosed by the multilayer memory layer ML. The multilayer memory layer ML may extend along the outer surface of the channel pattern CH. In other words, the multilayer memory layer ML extends along surfaces of the pillar parts PP and the connection part LP. The channel pattern CH may be formed to enclose a gap-fill insulating pattern FI.

The gap-fill insulating pattern FI is enclosed by the pillar parts PP. The space between the source line CSL and the gate stack GST1 or the GST2 is filled with the gap-fill insulating pattern FI. The gap-fill insulating pattern FI extends in the first direction I to pass through the gate stack GST1 or GST2. Parts of the gap-fill insulating pattern FI that pass through the gate stack GST1 or GST2 are enclosed by the pillar parts PP. A part of the gap-fill insulating pattern FI that is disposed between the source line CSL and the gate stack GST1 or GST2 is enclosed by the connection part LP. The source contact structure SCL may be disposed between the gap-fill insulating pattern FI that passes through the first gate stack GST1, and the gap-fill insulating pattern FI that passes through the second gate stack GST2.

The gap-fill pattern FI may have a height less than the pillar parts PP. In this case, a capping pattern CAP may be disposed on an upper end of each gap-fill insulating pattern FI. Each capping pattern CAP may be enclosed by an upper end of the associated pillar part PP. Each of the capping patterns CAP may be formed of a semiconductor layer including a first conductivity type dopant. For example, each of the capping patterns CAP may be formed of a silicon layer doped with an n-type dopant. Each of the capping patterns CAP may be used as a drain junction.

The capping patterns CAP may protrude further in the first direction I than the gate stacks GST1 and GST2. The capping patterns CAP may be covered with a first upper insulating layer UIL1.

Each of the supports IP may have a sidewall enclosed by the connection part LP. The multilayer memory layer ML extends between the connection part LP and the supports IP.

Each of the pillar parts PP of the channel pattern CH may be coupled to a corresponding one of the bit lines BL. The bit lines BL may be disposed on a second upper insulating layer UIL2. The second upper insulating layer UIL2 is formed on the first upper insulating layer UIL1. The bit lines BL may be coupled to the pillar parts PP of the channel pattern CH via bit line contact plugs BCT passing through the first and second upper insulating layers UIL1 and UIL2. The bit line contact plugs BCT may be coupled to the capping patterns CAP.

The connection part LP of the channel pattern CH may be coupled to the well structure WE. The well structure WE protrudes from the connection part LP in the first direction I and is spaced apart from the source line CSL. At least a portion of the well structure WE that comes into contact with the connection part LP of the channel pattern CH may include a second conductivity type dopant different from the first conductivity type dopant. The second conductivity type dopant may be a p-type dopant. The p-type dopant in the well structure WE may be a source of holes to be supplied to the channel pattern CH during an erase operation.

For example, the well structure WE may include a well doping layer WDP including an ohmic contact area OC, and a metal layer M3 disposed on the well doping layer WDP. The well doping layer WDP may come into contact with the connection part LP of the channel pattern CH and extend in the first direction I, and the well doping layer WDP may be formed lower than the gate stack GST1 or GST2. The well doping layer WDP may be a semiconductor layer doped with a second conductivity type dopant. For example, the well doping layer WDP may be a p-type doped silicon layer. A second conductivity type dopant may be distributed at a first concentration in the well doping layer WDP under the ohmic contact area OC. The ohmic contact area OC may include a second conductivity type dopant at a second concentration higher than the first concentration for the purpose of providing ohmic contact.

As shown in FIG. 3A, the well doping layer WDP may be formed such that a space between the insulating spacers IS is completely filled therewith. Alternatively, as shown in FIG. 4, the well doping layer WDP may be formed to have a U-shaped cross-sectional structure rather than having a shape that completely fills the space between the insulating spacers IS. In this case, the well structure WE may further include an undoped semiconductor layer UDP enclosed by the well doping layer WDP disposed between the insulating spacers IS. The undoped semiconductor layer UDP may remain after a process of forming the source contact layer SC of the source contact structure SCL has been performed. Thus, in an embodiment, the source contact layer SC may be formed of the undoped semiconductor layer UDP.

Referring to FIGS. 3A to 4, the connection part LP of the channel pattern CH may be coupled to the source line CSL through the source contact structure SCL. The source contact structure SCL may come into contact with the source line CSL and protrude from the source line CSL in the first direction to pass through the connection part LP. The source contact structure SCL may extend into the source line CSL. The source contact structure SCL may include a source contact layer SC and a metal layer M3. The source contact layer SC extends from the source line CSL in the first direction and may be formed lower than the gate stack GST1 or GST2. The source contact layer SC may include a lower end P which comes into contact with the source line CSL and the connection part LP of the channel pattern CH. The source contact layer SC may be formed of an undoped semiconductor layer. In more detail, the source contact layer SC may be formed of an undoped silicon layer. The lower end P of the source contact layer SC that comes into contact with the source line CSL may include a first conductivity type dopant diffused from the source line CSL. In accordance with an embodiment of the present disclosure provided to simplify a manufacturing process, a second conductivity type dopant different from the first conductivity type dopant may be distributed in an upper end of the source contact layer SC that faces the bit line BL, whereby a dummy contact area DC may be defined. The dummy contact area DC may be formed during a process of forming the ohmic contact area OC.

The source contact layer SC may include an undoped area. The undoped area may remain between the source line CSL and the dummy contact area DC. The undoped area may prevent formation of a PN diode structure caused by a connection between the dummy contact area DC and the source line CSL. The undoped area may block the supply of holes from the dummy contact area DC. Particularly, the undoped area may remain between the lower end P of the source contact layer SC in which the first conductivity type dopant diffused from the source line CSL is distributed, and the dummy contact area DC in which the second conductivity type dopant is distributed.

The metal layers M3 of the well structure WE and the source contact structure SCL may be formed through the same process. The metal layer M3 of the well structure WE comes into contact with the ohmic contact area OC and extends in the first direction. The metal layer M3 of the source contact structure SCL comes into contact with the dummy contact area DC and extends in the first direction. Each of the well structure WE and the source contact structure SCL may further include a barrier metal layer BM3 to prevent the metal layer M3 and the insulating spacers IS from coming into direct contact with each other.

According to the above-mentioned structure, the source contact structure SCL extends toward the source line CSL further than the well structure WE. In other words, the well structure WE is shorter than the source contact structure SCL. Furthermore, parts of the gap-fill pattern FI and the connection part LP remain between the well structure WE and the source line CSL.

Each of the gate stacks GST1 and GST2 is disposed between the source contact structure SCL and the corresponding well structure WE that are adjacent to each other. Each gate stack GST1, GST2 encloses the pillar parts PP and is disposed on the connection part LP.

Each gate stack GST1, GST2 may include gate electrodes SSLa, SSLb, WL1 to WLn, DSLa, and DSLb, and interlayer insulating layers ILD that are alternately stacked in the first direction.

Each interlayer insulating layer ILD may be formed of an insulating material such as an oxide layer. Each interlayer insulating layer ILD may be disposed between corresponding gate electrodes SSLa, SSLb, WL1 to WLn, DSLa, and DSLb that are disposed adjacent to each other in the first direction.

The gate electrodes SSLa, SSLb, WL1 to WLn, DSLa, and DSLb may include a source select line SSLa or SSLb that is used as a gate electrode of a source select transistor, word lines WL1 to WLn that are used as gate electrodes of memory cell transistors, and a drain select line DSLa or DSLb that is used as a gate electrode of a drain select transistor.

Among the gate electrodes SSLa, SSLb, WL1 to WLn, DSLa, and DSLb, the source select line SSLa that is disposed in a lowermost layer adjacent to the source line CSL may have a stacked structure including a first conductive layer CP1 and a second conductive layer CP2. Each of the first conductive layer CP1 and the second conductive layer CP2 may be formed of a conductive material selected from among various conductive materials. For example, each of the first conductive layer CP1 and the second conductive layer CP2 may include at least one of a doped silicon layer, a metal layer, a metal silicide layer, and a barrier metal layer.

In an embodiment, the first conductive layer CP1 may be formed of conductive material capable of functioning as an etching blocking layer, and the second conductive layer CP2 may be formed of conductive material suitable for forming a low-resistance line. In this case, the first conductive layer CP1 and the second conductive layer CP2 may be formed of different conductive materials. In more detail, the conductive material to be used for forming the first conductive layer CP1 may be selected based on an etching selectivity such that the first conductive layer CP1 may function as an etching blocking layer during a process of manufacturing the semiconductor device. For example, the first conductive layer CP1 may be formed of a doped silicon layer. The first conductive layer CP1 may include an n-type dopant. The first conductive layer CP1 may have a relatively large thickness so that the first conductive layer CP1 may function as an etch stopper during the manufacturing process. As a result, the thickness of the first conductive layer CP1 may be greater than a thickness of each of the word lines WL1 to WLn in the first direction. The second conductive layer CP2 may be formed of a conductive material having a resistance lower than a resistance of the first conductive layer CP1. For example, the second conductive layer CP2 may be formed of a tungsten layer. Unlike the lowermost source select line SSLa, the upper source select line SSLb may be formed of the same conductive material as the second conductive layer not including the first conductive layer CP1.

The word lines WL1 to WLn are stacked on the source select lines SSLa and SSLb and spaced apart from each other. Each of the word lines WL1 to WLn may be formed of the same conductive material as the conductive material of the second conductive layer CP2. Each of the word lines WL1 to WLn may further include a barrier metal layer.

The drain select line DSLa or DSLb is disposed over the word lines WL1 to WLn. The drain select line DSLa or DSLb may be formed of the same conductive material as the second conductive layer CP2. The drain select line DSLa or DSLb may further include a barrier metal layer.

The insulating spacers IS are disposed between the source contact structure SCL and the gate stacks GST1 and GST2, and between the well structure WE and the gate stacks GST1 and GST2. The insulating spacers IS extend along the sidewalls of the gate stacks GST1 and GST2. The well structure WE and the source contact structure SCL protrude toward the source line CSL further than the insulating spacers IS. The source contact structure SCL may include a horizontal extension part EP. The horizontal extension part EP protrudes sideways toward the connection part LP of the channel pattern CH to overlap with the corresponding insulating spacers IS. The channel pattern CH may be coupled to the horizontal extension part EP. The channel patterns CH extending from a space between the gap-fill insulating patterns FI and the gate stacks GST1 and GST2 into a space between the gap-fill insulating patterns FI and the source line CSL. The horizontal extension part EP is disposed between the gap-fill insulating pattern FI and the multilayer memory layer ML. The horizontal extension part EP may extend to overlap the corresponding gate stack GST1. Further, the horizontal extension part EP may protrude from a sidewall of a lower end of the source contact structure SCL that is adjacent to the source line CSL. The multilayer memory layer ML may protrude toward the source contact structure SCL further than the channel pattern CH and may be disposed on a surface of the horizontal extension part EP.

The connection part LP of the channel pattern CH that comes into contact with the well structure WE may extend to the insulating spacers IS. In other words, the connection part LP that comes into contact with the well structure WE protrudes sideways further than the sidewall of the gate stack GST1, to overlap the lower ends of the insulating spacers IS.

The source contact structure SCL and the well structure WE may protrude toward the upper lines BL and WPL further than the capping pattern CAP and the pillar parts PP of the channel pattern CH. Further, the source contact structure SCL may protrude toward the source line CSL further than the gate stacks GST so that the source contact structure SCL is coupled to the source line CSL.

The source contact structure SCL and the well structure WE may be covered with the second upper insulating layer UIL2. The well contact plug WCT may penetrate the second upper insulating layer UIL2. The well contact plug WCT is coupled to the well structure WE.

The upper lines BL and WPL may include the bit lines BL and the well pick-up line WPL, and may further include the source dummy line SDL described with reference to FIG. 2B. The source dummy line SDL may be coupled to the source contact structure SCL through the dummy contact plug (DCT of FIG. 2B) passing through the second upper insulating layer UIL2.

To simplify the manufacturing process, the upper lines BL, WPL, and SDL of FIG. 2B may be disposed on the same layer. The upper lines BL, WPL, and SDL of FIG. 2B may be formed in a third upper insulating layer UIL3 provided on the second upper insulating layer UIL2. The upper lines BL, WPL, and SDL of FIG. 2B may be made of a low-resistance metal.

A first conductivity type dopant may be distributed in a part of the connection part LP that is adjacent to the source line CSL.

The upper lines BL, WPL, and SDL of FIG. 2B and the metal layers M1, M2, and M3 may be made of a low-resistance material. For example, tungsten may be used as the low-resistance metal. Each of the barrier metal layers BM1, BM2, and BM3 may include a titanium nitride layer, a tungsten nitride layer, a tantalum nitride layer or the like to prevent diffusion of the metal.

In accordance with an embodiment of the present disclosure, during a read operation or a program operation of the semiconductor device, a current flow path may be formed in the channel pattern CH coupled between the bit line BL and the source line CSL. By turning on the discharge transistor CST, a precharge level of the bit line BL may be discharged through the current flow path formed in the channel pattern CH coupled between the bit line BL and the source line CSL.

In accordance with an embodiment of the present disclosure, during an erase operation of the semiconductor device, a current flow path may be formed in the channel pattern CH coupled between the bit line BL and the well structure WE. During the erase operation, an erase voltage may be applied to the well structure WE through the well pick-up line WPL. If the well structure WE includes a p-type dopant, the well structure WE may supply holes into the channel pattern CH by supplying the erase voltage. Thereby, in an embodiment of the present disclosure, the erase operation may be performed reliably.

In accordance with an embodiment of the present disclosure, the source contact structure SCL extends parallel to the well structure WE in the first direction. A source dummy line (SDL of FIG. 2B) suitable for reducing the resistance may be coupled to the source contact structure SCL extending in the first direction. Consequently, in an embodiment of the present disclosure, the resistance of the source line CSL may be reduced not only by the metal layer M3 of the source contact structure SCL but also by the source dummy line SDL.

Figure 5:
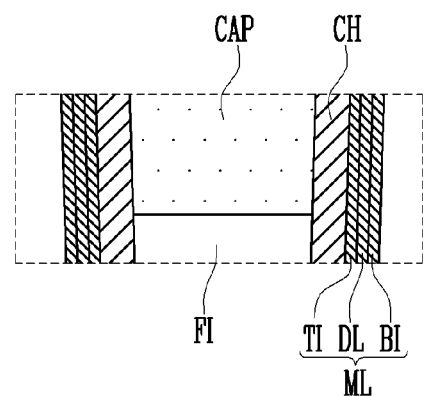
FIG. 5 shows an enlarged view of region C shown in FIG. 3A, 3B, or 4.

FIG. 5 shows an enlarged view of region C shown in FIG. 3A, 3B or 4.

Referring to FIG. 5, the channel pattern CH may have an inner surface facing the capping pattern CAP and the gap-fill insulating pattern FI, and an outer surface enclosed by the multilayer memory layer ML.

The multilayer memory layer ML may include a tunnel insulating layer TI enclosing the channel pattern CH, a data storage layer DL enclosing the tunnel insulating layer TI, and a blocking insulating layer BI enclosing the data storage layer DL. The data storage layer DL may be formed of a charge trap layer, a floating gate layer, a conductive nano dots, a phase change layer, a variable resistance layer, etc. For example, the data storage layer may store data to be changed using Fowler-Nordheim tunneling caused by a difference in voltage between the channel pattern CH and the word lines WL1 to WLn shown in FIGS. 3A to 4, and may be formed of a nitride layer capable of trapping charges. The blocking insulating layer BI may include an oxide layer capable of blocking charges. The tunnel insulating layer TI may be formed of a silicon oxide layer.

The channel pattern CH may be formed of a semiconductor layer, e.g., a silicon layer. Hereinafter, a method of manufacturing a semiconductor device in accordance with embodiments of the present disclosure will be described with reference to FIGS. 6A to 8B. The following processes may be performed after a substrate provided with a peripheral circuit including a discharge transistor has been provided.

FIGS. 6A to 6L show sectional views illustrating a method of manufacturing a semiconductor device in accordance with an embodiment of the present disclosure. FIGS. 6A to 6L show, by steps of the process, sectional views taken along line A-A' of FIG. 2B.

Figure 6A:
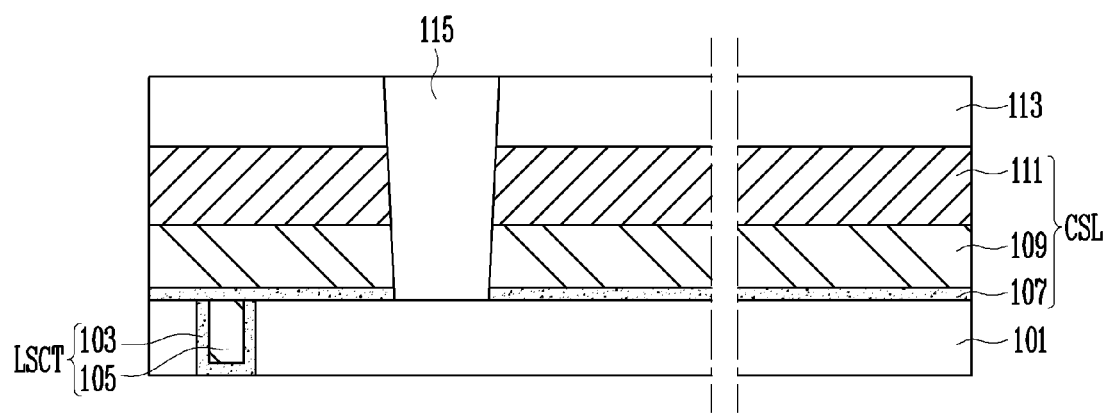
FIGS. 6A to 6L shows sectional views illustrating a method of manufacturing a semiconductor device in accordance with an embodiment of the present disclosure.

Referring to FIG. 6A, a lower source contact plug LSCT passing through the lower insulating layer 101 is formed. The lower insulating layer 101 may correspond to the second lower insulating layer LIL2 shown in FIGS. 3A and 3B. The step of forming the lower source contact plug LSCT may include the step of forming a contact hole by etching the lower insulating layer 101, the step of forming a barrier metal layer 103 along a surface of the contact hole, and the step of forming the metal layer 105 on the barrier metal layer 103.

Thereafter, a barrier metal layer 107, a metal layer 109, and a source doping semiconductor layer 111 that are provided for forming the source line CSL are successively stacked on the lower insulating layer 101 penetrated by the lower source contact plug LSCT. Subsequently, a sacrificial layer 113 is formed on the source doping semiconductor layer 111. The source doping semiconductor layer 111 may include a first conductivity type dopant. For example, the source doping semiconductor layer 111 may be formed of an n-type doped silicon layer. The sacrificial layer 113 may be formed of a material having an etching rate different than the source doping semiconductor layer 111. In more detail, the sacrificial layer 113 may be formed of a material which minimizes loss of the source doping semiconductor layer 111 and is selectively etchable. For example, the sacrificial layer 113 may be formed of a titanium nitride layer (TiN).

Thereafter, the sacrificial layer 113, the source doping semiconductor layer 111, the metal layer 109, and the barrier metal layer 107 are etched through an etching process using, as an etching barrier, a mask pattern (not shown) formed through a photolithography process. In this way, a source line CSL that is penetrated by source holes and brought into contact with the lower source contact plug LSCT may be patterned.

Thereafter, the above-mentioned mask pattern (not shown) is removed, and then supports 115 are formed so that the source holes are filled with the respective supports 115. The step of forming the supports 115 may include the step of forming an insulating layer such that the source holes are completely filled therewith, and the step of planarizing a surface of the insulating layer so that the sacrificial layer 113 is exposed. The insulating layer may be an oxide layer.

The metal layers 105 and 109 may be formed of a low-resistance metal such as tungsten to form a low-resistance line. Each of the barrier metal layers 103 and 107 may include titanium, a nitride layer, a tungsten nitride layer, a tantalum nitride layer or the like to prevent diffusion of the metal.

Figure 6B:
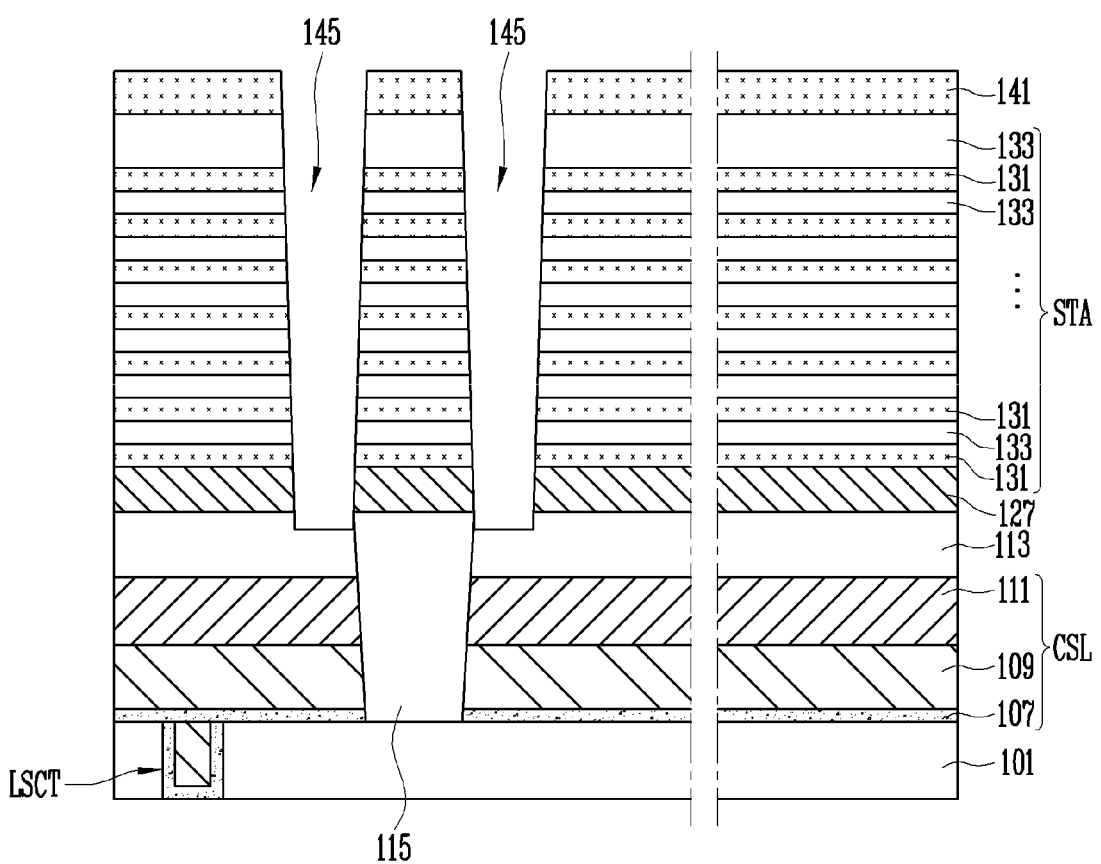

Referring to FIG. 6B, a stack STA is formed on the sacrificial layer 113. The stack STA may include a first conductive layer 127 stacked on the sacrificial layer 113, and first material layers 131 and second material layers 133 that are alternately stacked on the first conductive layer 127. The first material layers 131 define regions in which gate electrodes are to be disposed, and the second material layers 133 define regions in which interlayer insulating layers are to be disposed.

The first conductive layer 127 may be formed of material different from the materials of the first material layers 131 and the second material layers 133. In more detail, the first conductive layer 127 may be formed of material which may be used not only as a gate electrode, but also as an etch stopper during a following opening forming process. For example, the first conductive layer 127 may be formed of a doped silicon layer. In more detail, the first conductive layer 127 may be formed of a doped silicon layer including an n-type dopant.

The second material layers 133 may be formed of material different than the first material layers 131. The first material layers 131 may be made of a sacrificial insulating material, and the second material layers 133 may be made of an insulating material for interlayer insulating layers. In detail, each first material layer 131 may be formed of a silicon nitride layer, and each second material layer 133 may be formed of a silicon oxide layer.

Although not shown in the drawings, the first material layers 131 may be formed of second conductive layers for the gate electrodes SSLa, SSLb, WL1 to WLn, DSLa, and DSLb shown in FIGS. 3A and 3B, and the second material layers 133 may be formed of insulating material for interlayer insulating layers.

Subsequently, a mask pattern 141 is formed on the stack STA. The mask pattern 141 may be patterned through a photolithography process. The mask pattern 141 may include openings that open regions in which first holes 145 are to be defined. Thereafter, the first holes 145 through which the sacrificial layer 113 is exposed may be formed by etching the stack STA through an etching process using the mask pattern 141 as an etching barrier If the sacrificial layer 113 is made of material including metal such as titanium nitride TiN, the bottom of each first hole 145 may be formed to have a relatively large width using a large difference in etching rate between the stack STA and the sacrificial layer 113.

Central axes of the first holes 145 may be misaligned with those of the supports 115. For example, the first holes 145 may be disposed to not overlap the supports 115.

Figure 6C:
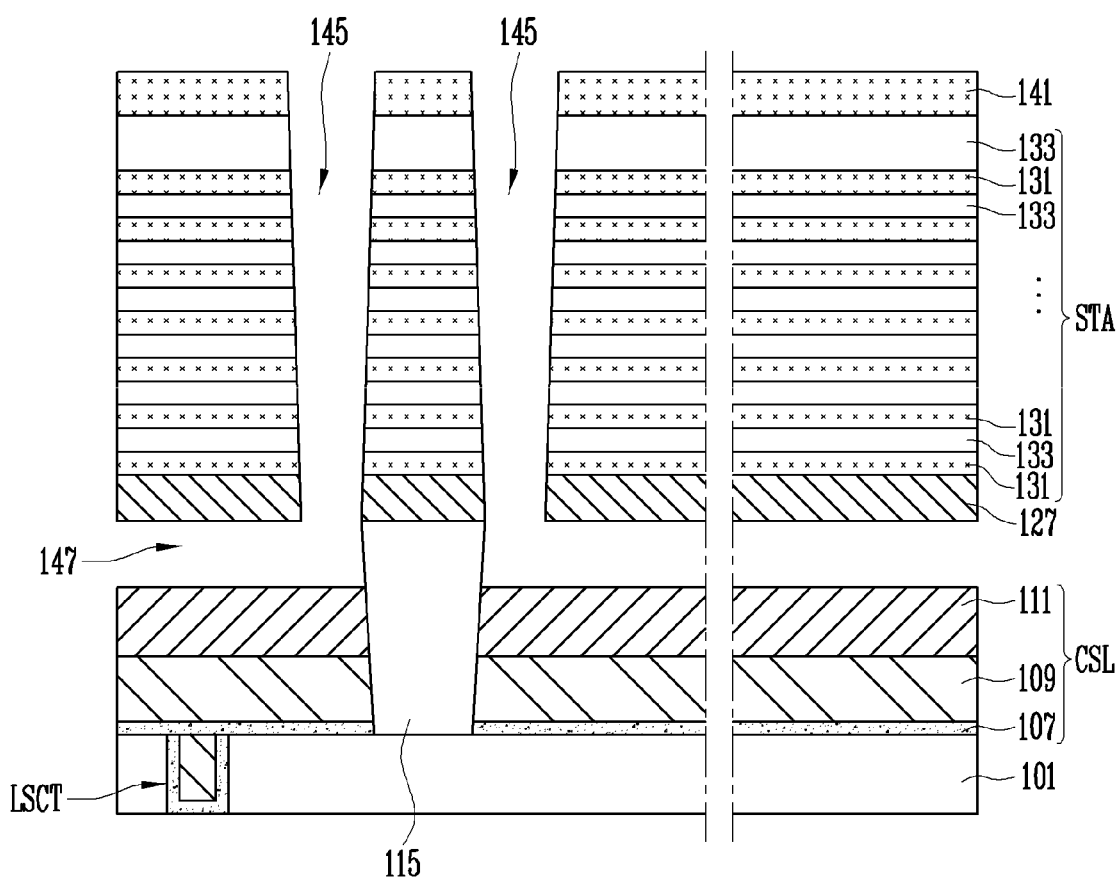

Referring to FIG. 6C, the sacrificial layer 113 shown in FIG. 6B is removed through the first holes 145. Consequently, a horizontal space 147 opens in a region in which the sacrificial layer 113 has been removed. The horizontal space 147 meets the first holes 145, and is defined between the source doping semiconductor layer 111 and the stack STA.

Upper ends of the supports 115 may be exposed by the horizontal space 147. The supports 115 may support the stack STA such that the gap of the horizontal space 147 is maintained.

Figure 6D:
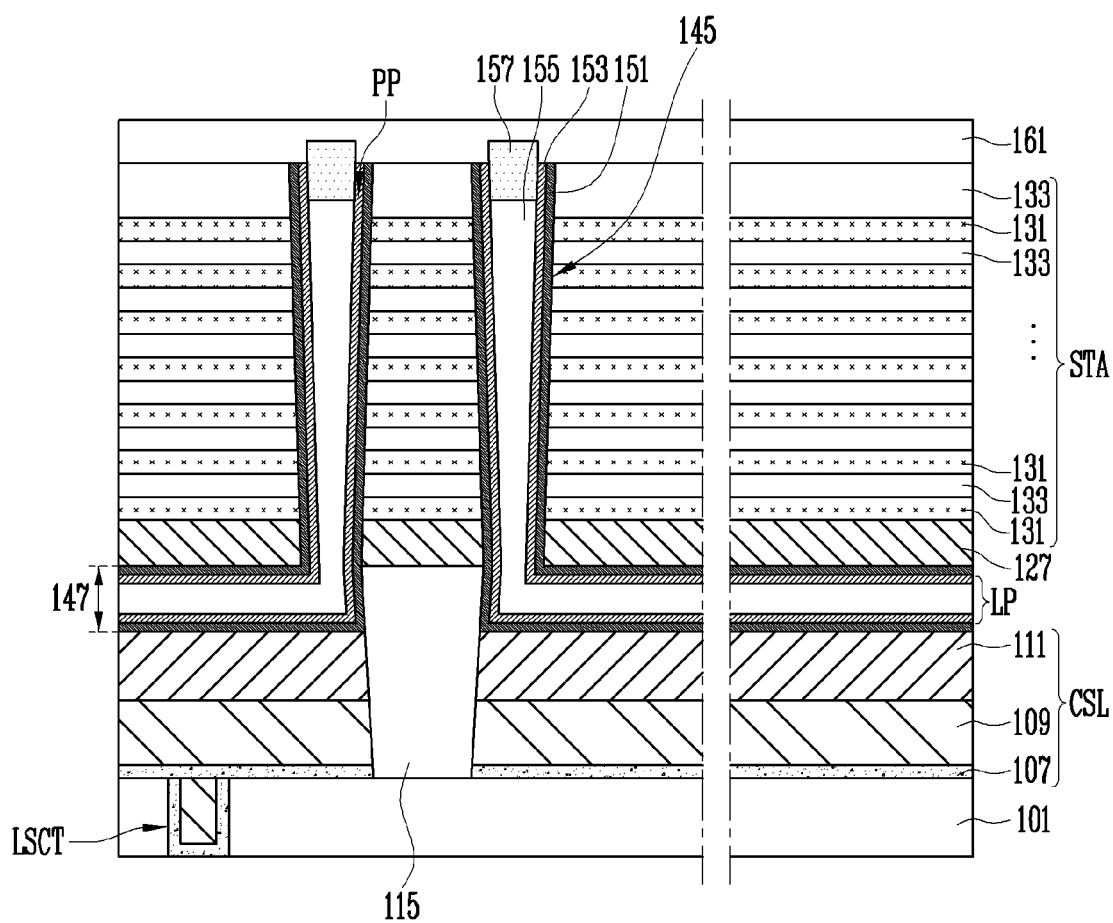

Referring to FIG. 6D, a multilayer memory layer 151 extending along surfaces of the first holes 145, a surface of the horizontal space 147, and side surfaces of the supports 115 is formed. The step of forming the multilayer memory layer 151 may include the step of forming a blocking insulating layer, the step of forming a data storage layer on the blocking insulating layer, and the step of forming a tunnel insulating layer on the data storage layer. The structure and material of each of the blocking insulating layer, the data storage layer, and the tunnel insulating layer are the same as those described with reference to FIG. 5.

Thereafter, a channel layer 153 is formed on a surface of the multilayer memory layer 151. The channel layer 153 may extend along the surfaces of the first holes 145, the surface of the horizontal space 147, and the side surfaces of the supports 115 and be enclosed by the multilayer memory layer 151.

The channel layer 153 may be formed of a semiconductor layer. For instance, the channel layer 153 may be formed by depositing a silicon layer. The channel layer 153 may be formed of an integrated layer without having an interface. The channel layer 153 may include the connection part LP and the pillar parts PP extending from the connection part LP in the first direction. The connection part LP is disposed on the source line CSL and extends along both the surface of the horizontal space 147 between the source line CSL and the stack STA and along the surfaces of the supports 115. The pillar parts PP are enclosed by the stack STA.

A central region of each first hole 145 defined by the channel layer 153 and a central region of the horizontal space 147 are filled with a gap-fill insulating layer 155. The gap-fill insulating layer 155 is enclosed by the channel layer 153. The step of forming the gap-fill insulating layer 155 may include the step of filling the first holes 145 and the horizontal space 147 with a material layer having fluidity, and the step of hardening the material layer having the fluidity. Polysilazane (PSZ) may be used as the material layer having fluidity.

The step of forming the gap-fill insulating layer 155 may further include the step of recessing a portion of the gap-fill insulating layer 155 so that the height of the gap-fill insulating layer 155 is less than a height of the channel layer 153. Thereby, the gap-fill insulating layer 155 is enclosed by the channel layer 153, and has a height less than a height of the channel layer 153. A central region of the channel layer 153 that is exposed on the gap-fill insulating layer 155 may be filled with the capping pattern 157. The capping pattern 157 may be formed of a doped silicon layer including a first conductivity type dopant.

Subsequently, although not shown, a stepwise structure may be formed by patterning the stack STA. Thereafter, the mask pattern is removed.

Thereafter, a first upper insulating layer 161 is formed on the stack STA to cover the capping pattern 157 and the stepwise structure. A surface of the first upper insulating layer 161 may be planarized.

Figure 6E:
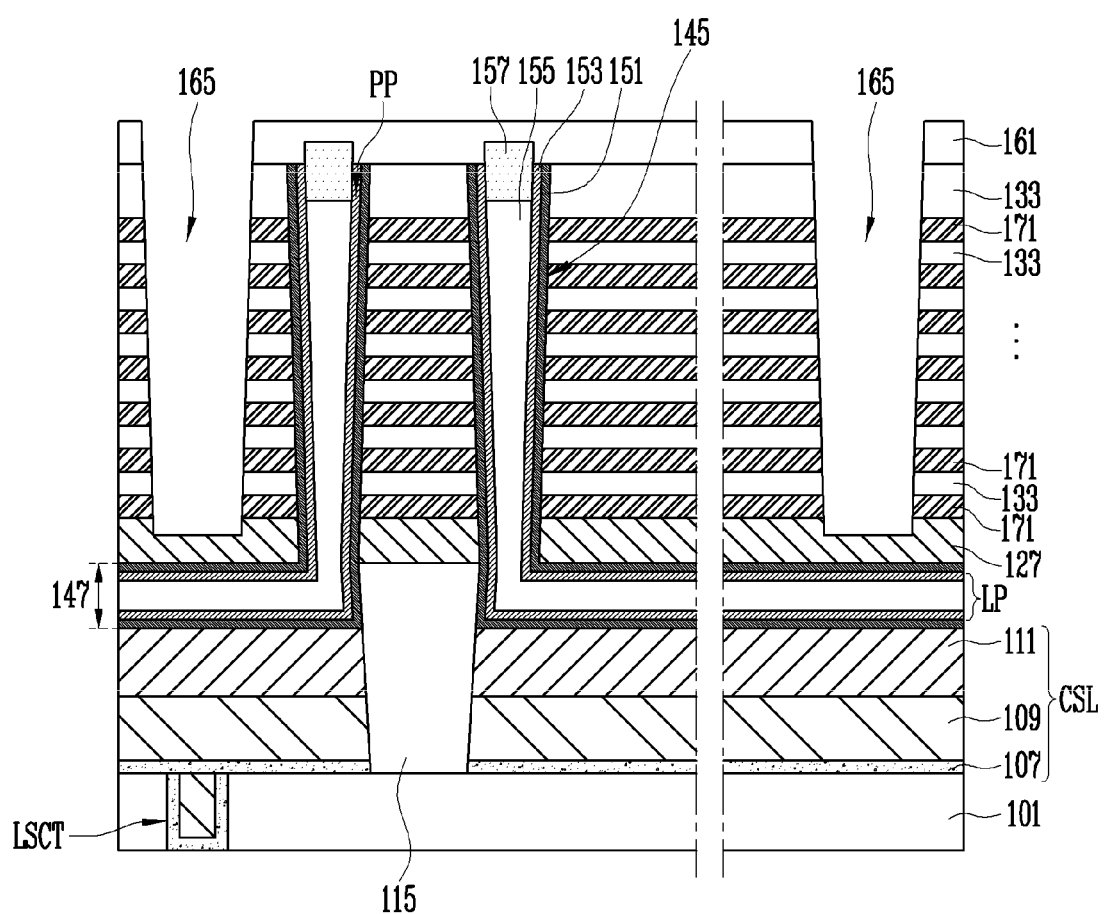

Referring to FIG. 6E, first trenches 165 are formed by etching the upper insulating layer 161 and the stack STA described with reference to FIG. 6D through an etching process that stops when the first conductive layer 127 is exposed. The first conductive layer 127 is made of a material having an etch rate different than the first material layers 131 and the second material layers 133 of the stack STA shown in FIG. 6D. As a result, the depth of each of the first trenches 165 may be easily controlled such that the first trenches 165 pass through the first material layers 131 and the second material layers 133 without passing through the first conductive layer 127. To form the first trenches 165, a mask pattern (not shown) that opens a region in which the first trenches 165 are to be formed may be formed on the upper insulating layer 161. The mask pattern may be removed after the first trenches 165 have been formed. The first trenches 165 are formed to define spaces for arrangement of the source contact structure SCL and the well structure WE. In a plan view, the first trenches 165 may extend parallel to each other in the second direction.

If the first material layers 131 are formed of sacrificial insulating material, the first material layers 131 may be replaced with second conductive layers 171 through the first trenches 165. The step of replacing the first material layers 131 with the second conductive layers 171 may include a step of removing the first material layer 131 through the first trenches 165 and opening gate areas, the step of filling the gate areas with a third material layer, and the step of removing the third material layer from the first trenches 165 such that the third material layer is divided into the second conductive layers 171. The third material layer may be a conductive material forming the second conductive layers 171 and may be a metal layer having resistance lower than a resistance of the first conductive layer 127. Before the third material layer is formed, an aluminum oxide layer (not shown) may be further formed along surfaces of the gate areas. The aluminum oxide layer functions as a blocking insulating layer.

Unlike described above, if the first material layers 131 are made of a conductive material, the first material layers 131 may remain separated into a plurality of gate electrodes by the first trenches 165 without being replaced with the second conductive layers 171.

Figure 6F:
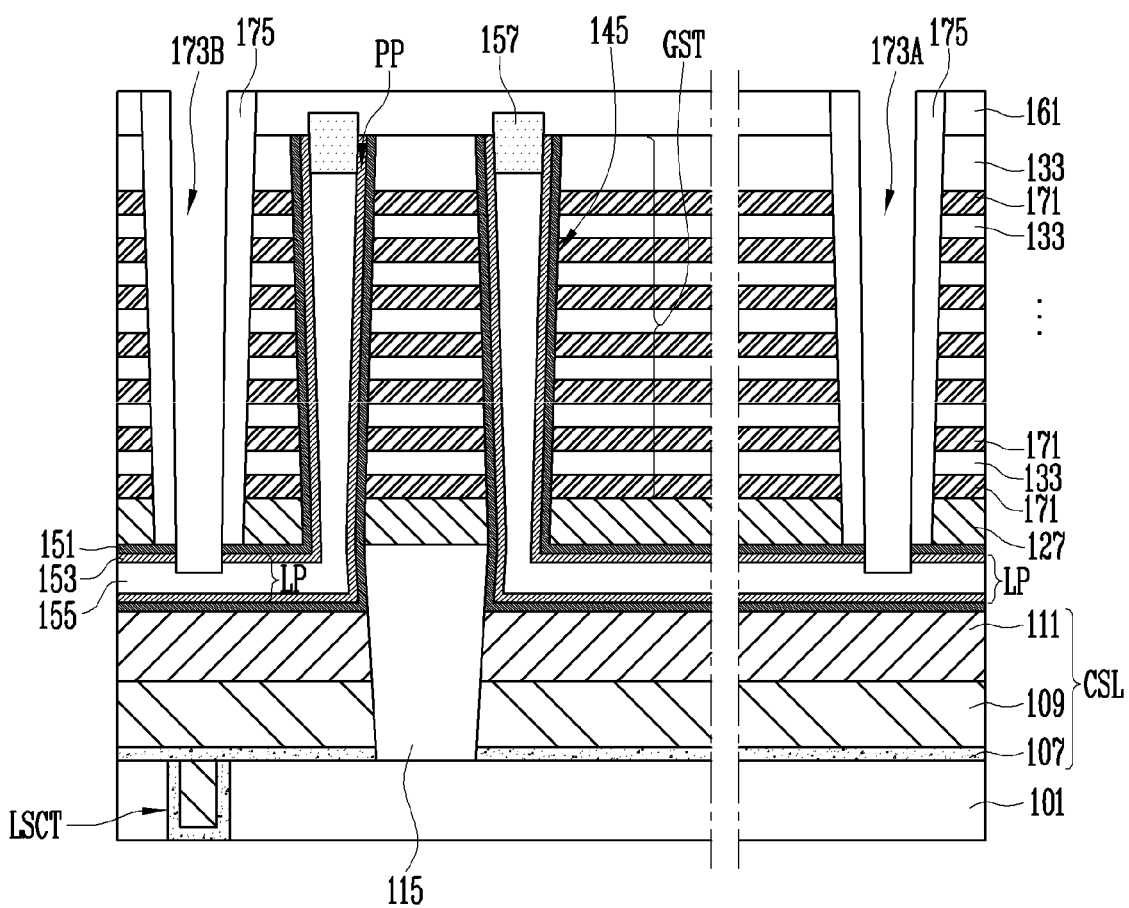

Referring to FIG. 6F, to extend the first trenches 165 to a depth such that the first conductive layer 127 is penetrated, the first conductive layer 127 may be etched using an etch-back process. Thereby, the gate stacks GST described with reference to FIGS. 3A to 3B may be patterned. Hereinbelow, the first trenches 165 having an extended length will be defined in a first opening 173A and a second opening 173B. The stack is divided into gate stacks GST by the first opening 173A and the second opening 173B. Each of the gate stacks GST is disposed between the corresponding first and second openings 173A and 173B that are adjacent to each other. The first opening 173A and the second opening 173B are formed to define spaces for arrangement of the source contact structure SCL and the well structure WE that are shown in FIG. 2A. In a plan view, the first opening 173A and the second opening 173B may extend parallel to each other in the second direction.

Thereafter, insulating spacers 175 may be formed on sidewalls of the first and second openings 173A and 173B. The step of forming the insulating spacer 175 may include the step of depositing an insulating layer along the surfaces of the first and second openings 173A and 173B, and the step of etching the insulating layer through an etch-back process. During the step of etching the insulating layer, the multilayer memory layer 151 may be exposed through the bottom of each of the first and second openings 173A and 173B.

Thereafter, the connection part LP of the channel layer 153 is exposed by etching the multilayer memory layer 151, which is exposed through the bottom of each of the first and second openings 173A and 173B. Subsequently, the gap-fill insulating layer 155 may be exposed by etching the connection part LP of the exposed channel layer 153. Thereby, each of the first and second openings 173A and 173B may extend to pass through the multilayer memory layer 151 and the connection part LP of the channel layer 153 to expose the gap-fill insulating layer 155. The first opening 173A and the second opening 173B may extend toward the source line CSL further than the insulating spacers 175. Each of the first and second openings 173A and 173B may be formed to a depth to which an upper surface of the connection part LP of the channel 153 is exposed.

Figure 6G:
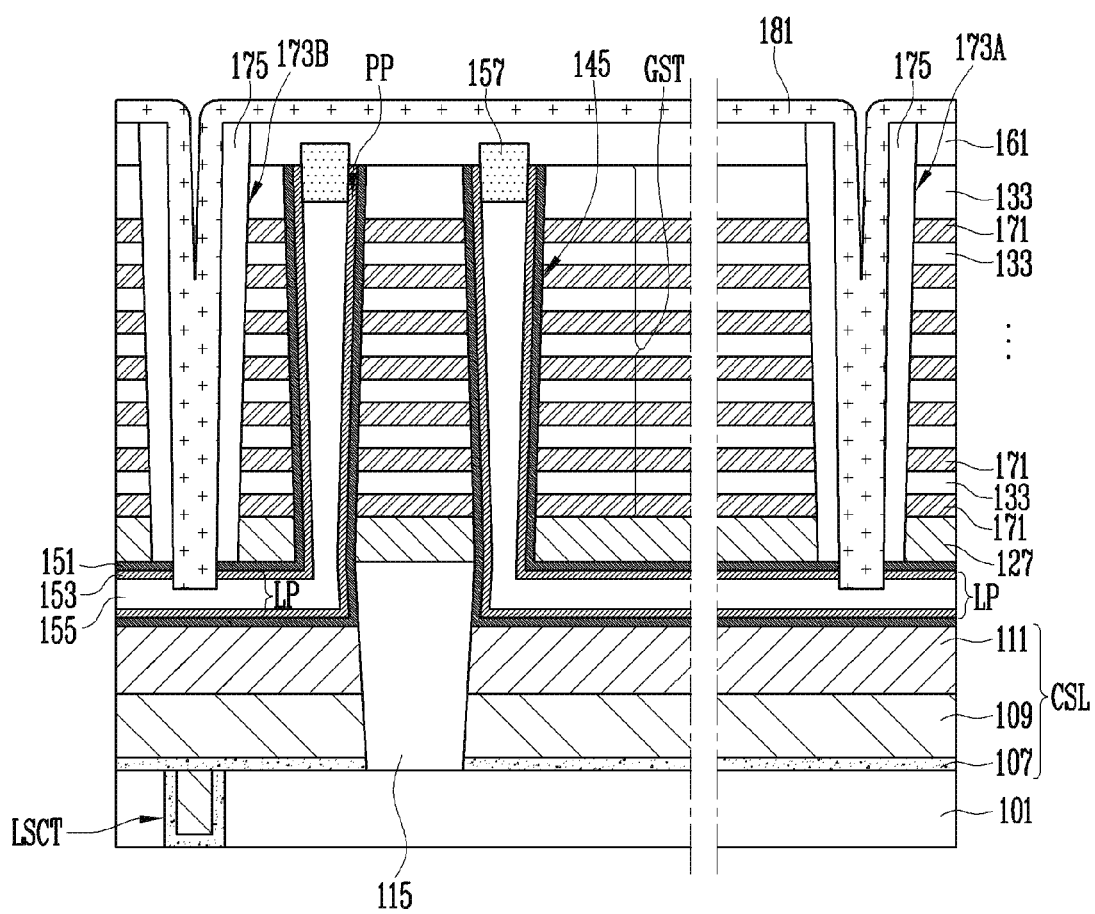

Referring to FIG. 6G, a well doping layer 181 is formed along the first opening 173A and the second opening 173B. In more detail, the well doping layer 181 is formed on the surfaces of the insulating spacers 175, the side surface of the multilayer memory layer 151 that is exposed through the first and second openings 173A and 173B, the sidewall of the connection part LP, and the surface of the gap-fill insulating layer 155. The well doping layer 181 comes into contact with the channel layer 153.

The well doping layer 181 is formed of a semiconductor layer including at a first concentration a second conductivity type dopant different from the first conductivity type dopant. The second conductivity type dopant may be a p-type dopant capable of supplying holes to the channel layer 153. For example, the well doping layer 181 may be formed of a p-type doped silicon layer.

The well doping layer 181 may have a thickness at which a lower portion of each of the first and second openings 173A and 173B may be completely filled with the well doping layer 181. The thickness of the well doping layer 181 may be modified in various ways, and one of the modifications will be described later herein with reference to FIG. 8A.

Figure 6H:
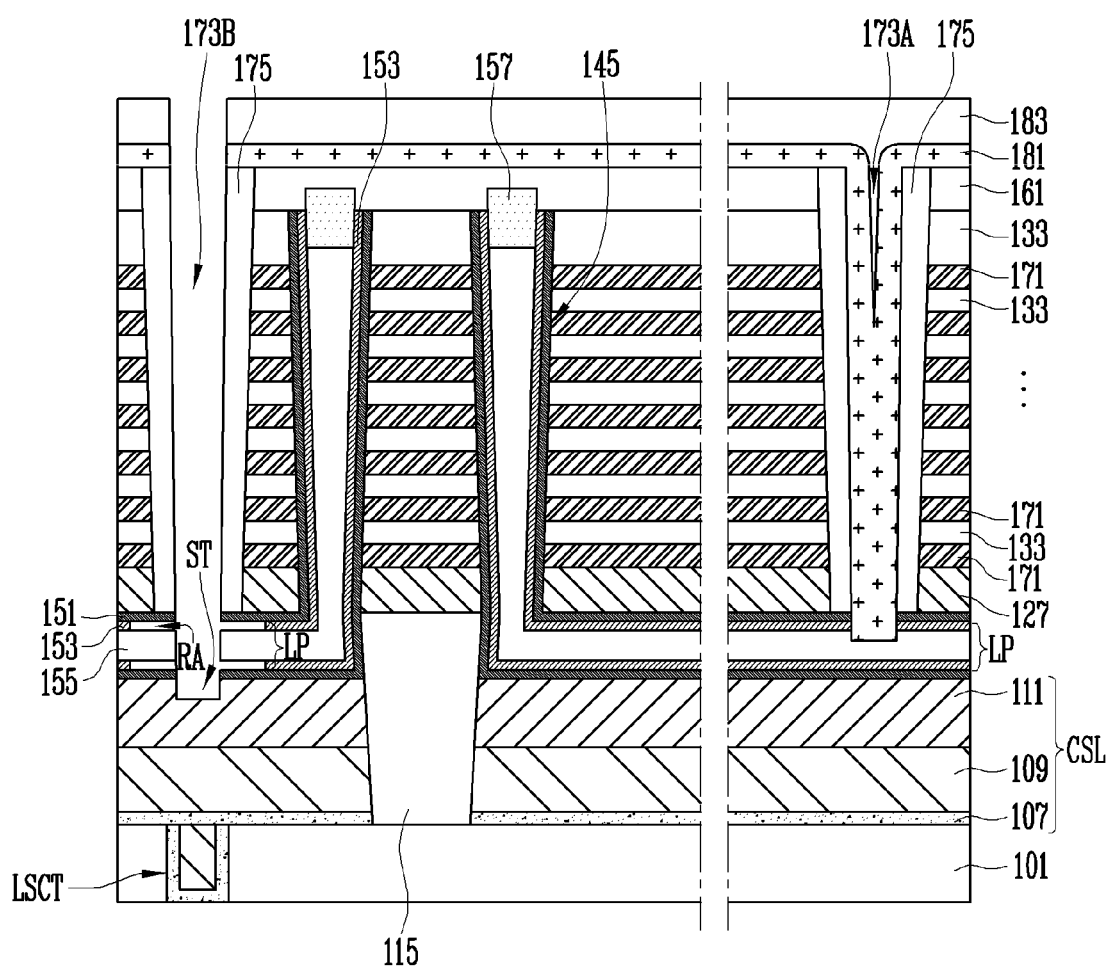

Referring to FIG. 6H, a mask pattern 183 is formed on the well doping layer 181. The mask pattern 183 blocks the first opening 173A and opens the second opening 173B. The well doping layer 181 is removed from the second opening 173B through an etching process using the mask pattern 183 as an etching barrier. Thereby, the second opening 173B and the insulating spacers 175 disposed in the second opening 173B are exposed.

Thereafter, a source trench ST through which the source line CSL is exposed may be formed by etching, through the second opening 173B, the gap-fill insulating layer 155 under the second opening 173B, the multilayer memory layer 151, and the connection part LP of the channel layer 153. The source doping semiconductor layer 111 of the source line CSL may be exposed to a depth that the source trench ST attains.

An additional first conductivity dopant may be doped in the source doping semiconductor layer 111 exposed through the source trench ST.

During a process of forming the source trench ST, the connection part LP of the channel layer 153 may be etched in a direction parallel to the source line CSL, whereby a recess area RA may be defined. The recess area RA may extend in a horizontal direction from a side portion of the source trench ST and overlap with lower ends of the insulating spacers 175.

Figure 6I:
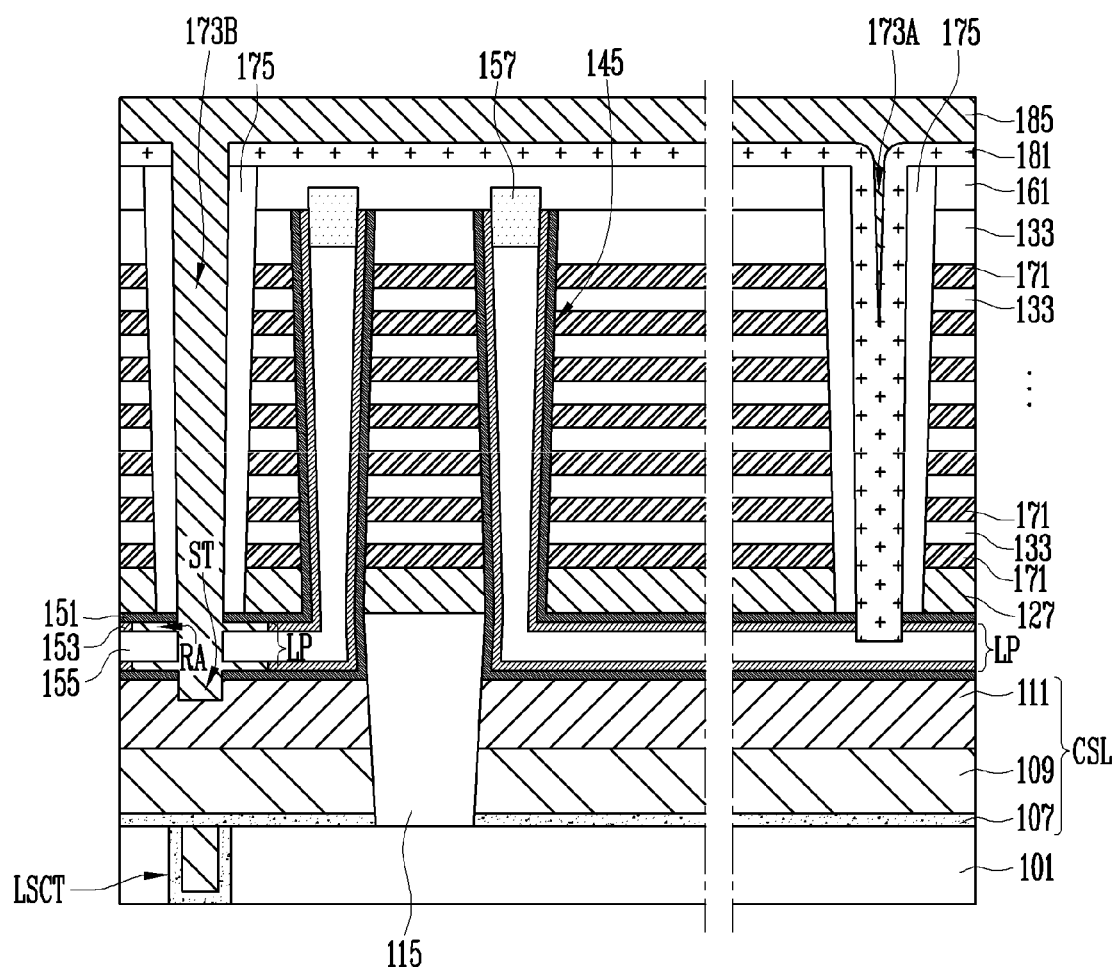

Referring to FIG. 6I, the well doping layer 181 that remains in the first opening 173A is exposed by removing the mask pattern 183 described with reference to FIG. 6H. Subsequently, a source contact layer 185 is formed on the well doping layer 181 so that the source trench ST and the second opening 173B are filled with the source contact layer 185. The source contact layer 185 may be formed of an undoped semiconductor layer. For example, the source contact layer 185 may be formed of an undoped silicon layer. If the recess area RA has been formed, the recess area RA is filled with the source contact layer 185.

The source contact layer 185 may electrically couple the connection part LP of the channel layer 153 with the source line CSL. The first conductivity type dopant may be diffused from the source doping semiconductor layer 111 into both a lower portion of the source contact layer 185 that is adjacent to the source doping semiconductor layer 111 and into the connection part LP coupled to the source contact layer 185. Here, a height of diffusion of the first conductivity type dopant may be controlled so that the first conductivity type dopant is prevented from being diffused into an upper portion of the source contact layer 185.

Figure 6J:
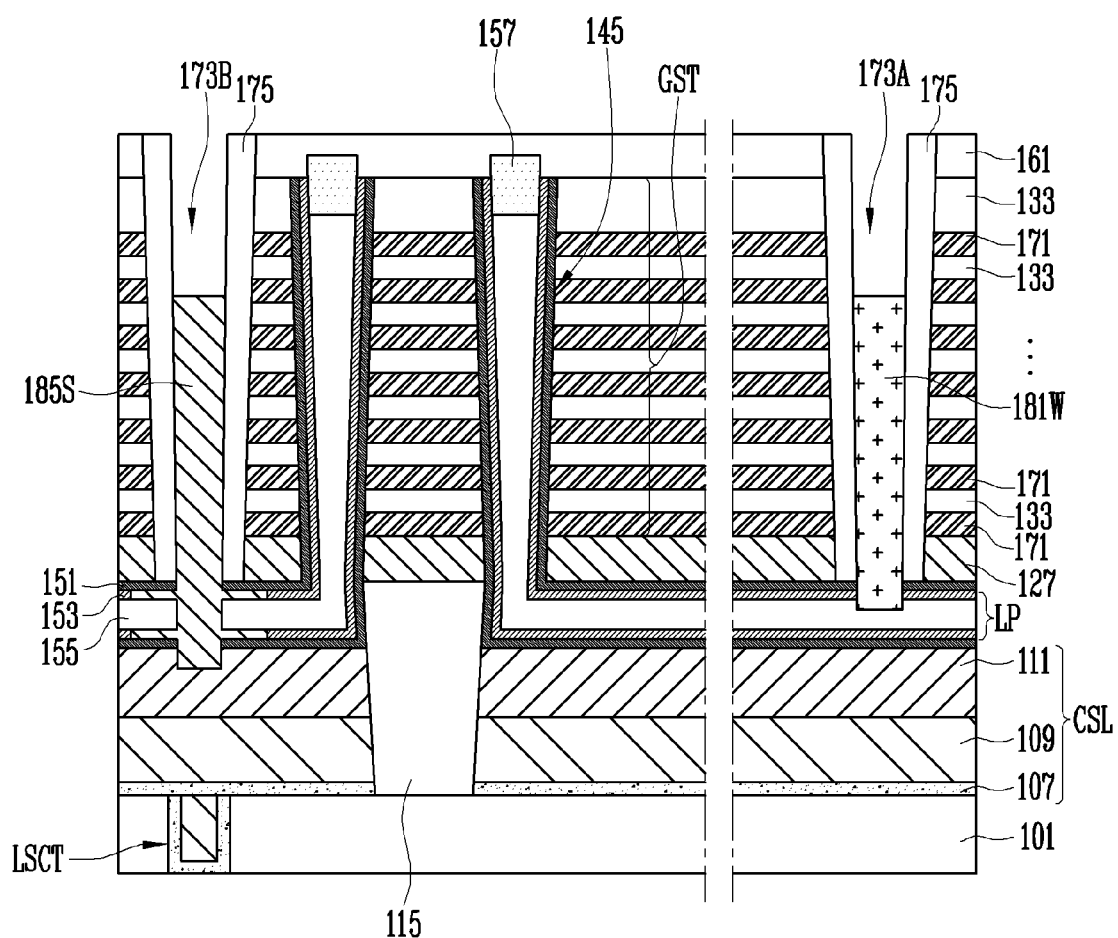

Referring to FIG. 6J, the well doping layer 181 and the source contact layer 185 are etched so that the well doping layer 181 and the source contact layer 185 that are shown in FIG. 6I remain at a height less than a height of the upper surface of the gate stack GST. Thereby, an upper end of each of the first and second openings 173A and 173B is exposed. The well doping layer 181 remains as a first well pattern 181W in only the first opening 173A. The source contact layer 185 remains as the first source contact pattern 185S in only the second opening 173B. In addition, an upper surface of the first upper insulating layer 161 is exposed.

Figure 6K:
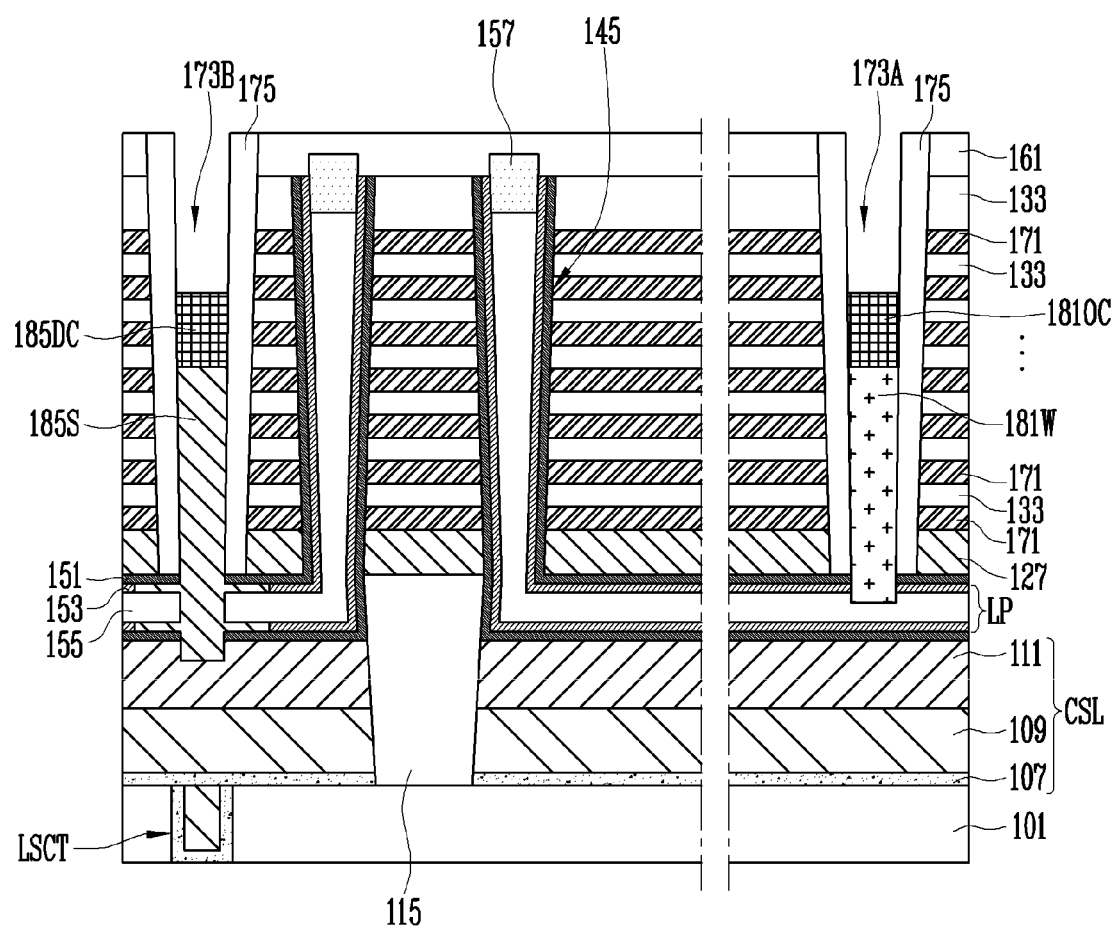

Referring to FIG. 6K, a second conductivity type dopant is implanted at a second concentration higher than the first concentration into upper ends of the first well pattern 181W and the first source contact pattern 185S that remain exposed through the first opening 173A and the second opening 173B. Thereby, an ohmic contact area 181OC is defined on the upper end of the first well pattern 181W, and a dummy contact area 185DC is defined on the upper end of the first source contact pattern 185S.

Figure 6L:
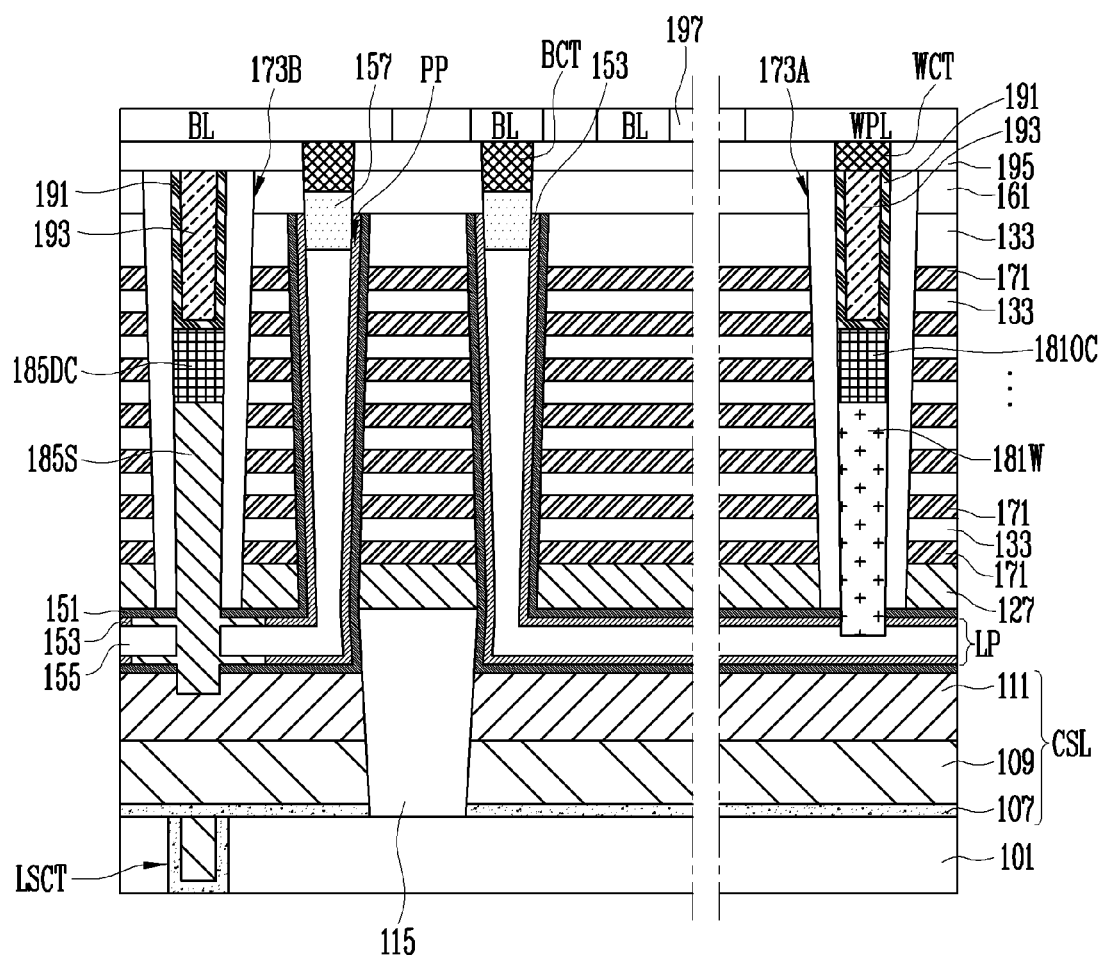

Referring to FIG. 6L, the upper end of each of the first and second openings 173A and 173B may be completely filled with a barrier metal layer 191 and a metal layer 193. The metal layer 193 may be provided to form a low-resistance line and may be formed of low-resistance conductive material such as tungsten. The barrier metal layer 191 may include a titanium nitride layer, a tungsten nitride layer, a tantalum nitride layer, or the like to prevent diffusion of metal.

The source contact structure SCL and the well structure WE that are shown in FIG. 3A may be formed through the above-mentioned process.

Thereafter, a second upper insulating layer 195 may be formed on the first upper insulating layer 161 to cover the barrier metal layer 191 and the metal layer 193. Subsequently, contact plugs BCT and WCT passing through at least one of the first upper insulating layer 161 and the second upper insulating layer 195 may be formed. Here, the dummy contact plug DCT shown in FIG. 2B may be further formed. The bit line contact plug BCT may be brought into contact with the capping pattern 157 and may be electrically coupled to the pillar parts PP of the channel layer 153. The well contact plug WCT may come into contact with the metal layer 193 in the first opening 173A. Although not shown, if the dummy contact plug DCT is formed, the dummy contact plug DCT may come into contact with the metal layer 193 in the second opening 173B.

Thereafter, a third upper insulating layer 197 may be formed on the second upper insulating layer 195 to cover the contact plugs BCT and WCT. The upper lines BL and WPL are thereafter formed and coupled to the contact plugs BCT and WCT through the third upper insulating layer 197. Including the bit line BL and the well pick-up line WPL, the upper lines BL and WPL may further include the source dummy line SDL shown in FIG. 2B. At least one of the well pick-up line WPL and the source dummy line SDL may be formed simultaneously with the bit line BL.

The bit line BL may be coupled to the pillar parts PP of the channel layer 153 via the bit line contact plug BCT and the capping pattern 157. The well pick-up line WPL may be coupled to the metal layer 193 in the first opening 173A via the well contact plug WCT. The metal layer 193 in the second opening 173B may be coupled to the source dummy line SDL shown in FIG. 2B via the dummy contact plug DCT shown in FIG. 2B.

Figure 7:
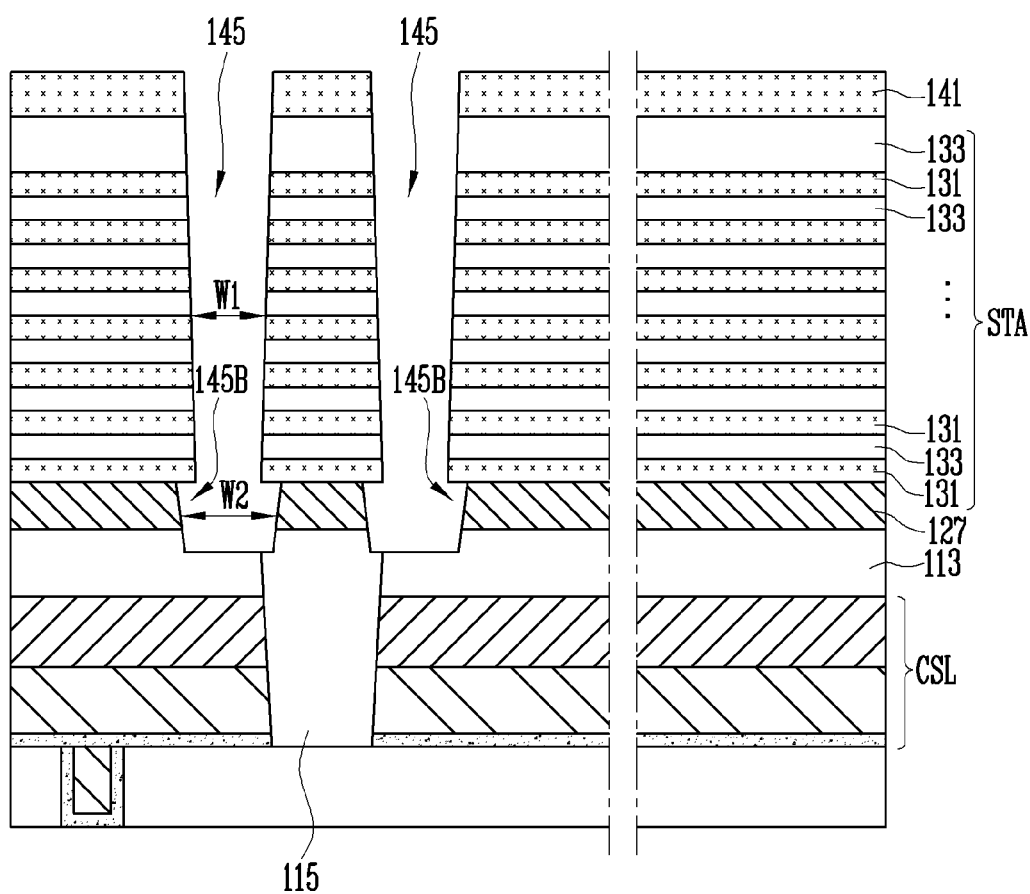
FIG. 7 shows a sectional view illustrating a method of manufacturing a semiconductor device in accordance with an embodiment of the present disclosure.

FIG. 7 shows a sectional view illustrating a method of manufacturing a semiconductor device in accordance with an embodiment of the present disclosure. Particularly, FIG. 7 is a sectional view illustrating a modification of a process of forming a hole passing through the stack.

Referring to FIG. 7, a source line CSL and a sacrificial layer 113 that are penetrated by supports 115 are formed through processes described with reference to FIG. 6A. Thereafter, the stack STA and the mask pattern 141 described with reference to FIG. 6B are formed. Subsequently, as described with reference to FIG. 6B, the step of forming the mask pattern 141 and the step of forming the first holes 145 are performed. The width of a lower end of each of the first holes 145 may be thereafter widened by selectively etching the first conductive layer 127 having an etching rate different than an etching rate of the first and second material layers 131 and 133 through side surfaces of the first holes 145. If the widened portion is defined as a second hole 145B, a second width W2 of the second hole 145B is greater than a first width W1 of the first hole 145. Thereby, during a following process, a deposition margin of the multilayer memory layer and the channel layer may be secured.

After the second hole 145B has been formed, the processes described with reference to FIGS. 6C to 6L may be performed.

Figure 8A:
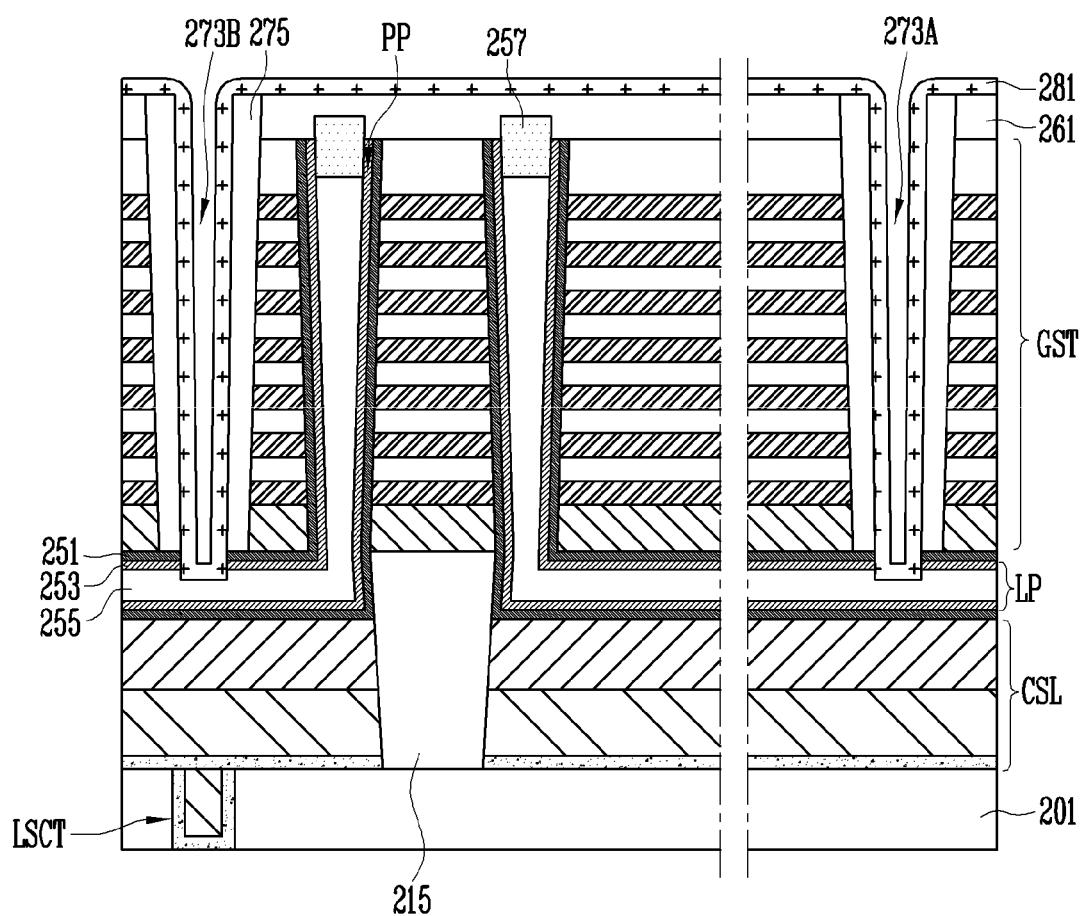
FIGS. 8A and 8B are sectional views illustrating a method of manufacturing a semiconductor device in accordance with an embodiment of the present disclosure.
Figure 8B:
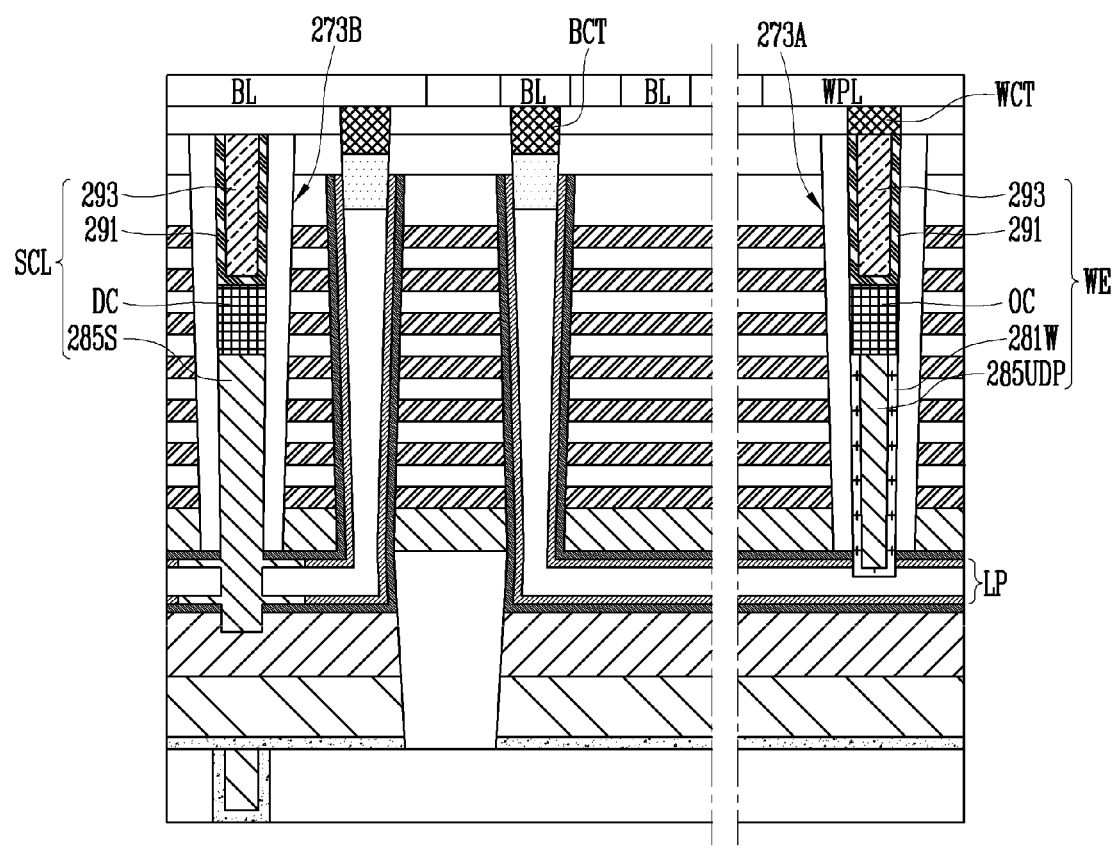

FIGS. 8A and 8B show sectional views illustrating a method of manufacturing a semiconductor device in accordance with an embodiment of the present disclosure. Particularly, FIGS. 8A and 8B show sectional views illustrating a modification of the process of forming the well doping layer.

Referring to FIG. 8A, a lower insulating layer 201, a lower source contact plug LSCT, a source line CSL, a support 215, a multilayer memory layer 251, a channel layer 253, a gap-fill insulating layer 255, a capping pattern 257, a first upper insulating layer 261, gate stacks GST, a first opening 273A, a second opening 273B, and insulating spacers 275 are formed through the processes described with reference to FIGS. 6A to 6F.

The first opening 273A and the second opening 273B separate the gate stacks GST from each other and extend toward the source line CSL further than the insulating spacers 275 so that the connection part LP of the channel layer 253 is exposed.

Thereafter, a well doping layer 281 is formed along the first opening 273A and the second opening 273B. The well doping layer 281 comes into contact with the channel layer 253. A central region of each of the first and second openings 273A and 273B may be left open by the well doping layer 281.

The well doping layer 281 may be formed of the same material layer as the well doping layer 181 described with reference to FIG. 6G.

Referring to FIG. 8B, the same processes as described with reference to FIGS. 6H to 6j are performed. Thereby, a first well pattern 281W and a first source contact pattern 285S are defined. In accordance with an embodiment of the present disclosure, the first well pattern 281W may be patterned to have a U-shaped cross-sectional structure. Consequently, an undoped layer 285UDP may remain in the first opening 273A during the process of forming the first source contact pattern 285S. The undoped layer 285UDP may be made of the same material as that of a source contact layer that forms the first source contact pattern 285S, and remain enclosed by the first well pattern 281W in the first opening 273A.

Thereafter, an ohmic contact area OC and a dummy contact area DC may be formed by performing the same process as that described with reference to FIG. 6K. The ohmic contact area OC is defined in upper ends of the first well pattern 281W and the undoped layer 285UDP. The dummy contact area DC is defined in an upper end of the first source contact pattern 285S.

Thereafter, as described with reference to FIG. 6L, an upper end of each of the first and second openings 273A and 273B is completely filled with the barrier metal layer 291 and the metal layer 293. Thereby, the source contact structure SCL and the well structure WE described with reference to FIG. 4 may be formed.

Thereafter, in the same manner as that described with reference to FIG. 6L, a following process of forming the contact plugs BCT and WCT and the upper lines BL and WPL may be performed.

Figure 9:
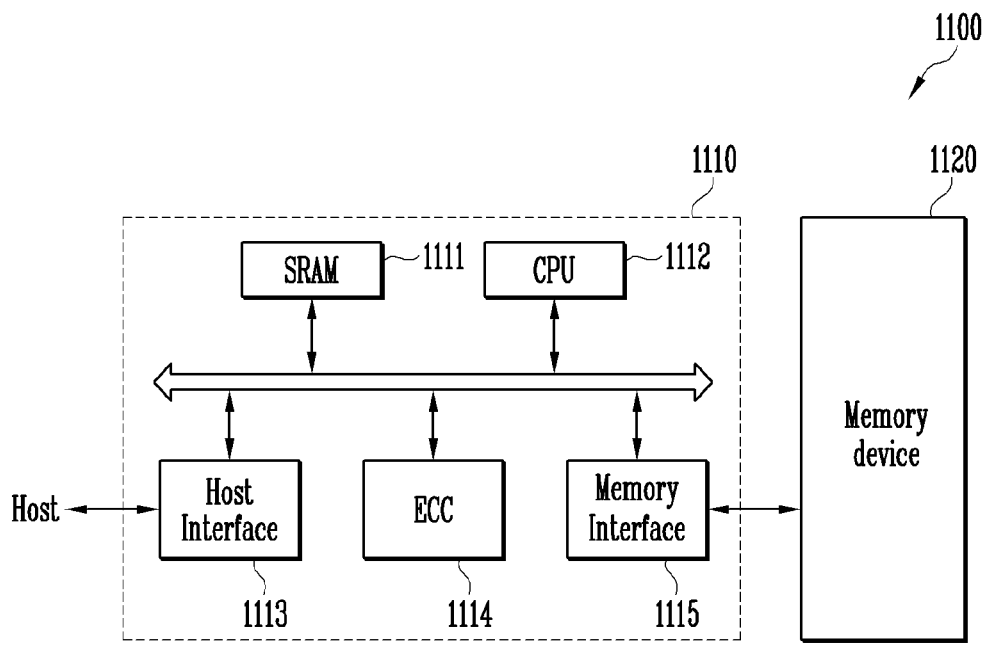
FIG. 9 shows a block diagram illustrating the configuration of a memory system in accordance with an embodiment of the present disclosure.

FIG. 9 shows a block diagram illustrating a configuration of a memory system 1100 in accordance with an embodiment of the present disclosure.

Referring FIG. 9, the memory system 1100 in accordance with an embodiment includes a memory device 1120 and a memory controller 1110.

As described with reference to FIGS. 3A to 4, the memory device 1120 may include a well structure and a source contact structure that are formed to different depths in opposite sides of a gate stack and coupled to a channel pattern. The well structure is spaced apart from a source line disposed below the gate stack, and the source contact structure extends to a depth greater than a depth of the well structure so that the source contact structure comes into contact with the source line.

The memory controller 1110 may be configured to control the memory device 1120, and include a static random access memory (SRAM) 1111, a CPU 1112, a host interface 1113, an error correction code (ECC) 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 10:
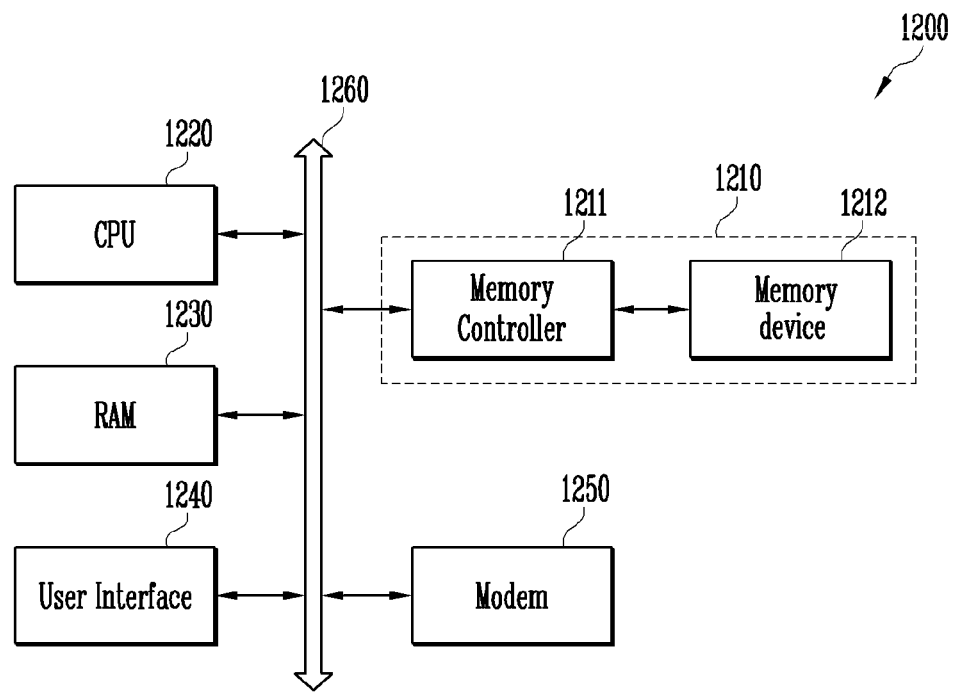
FIG. 10 shows a block diagram illustrating the configuration of a computing system in accordance with an embodiment of the present disclosure.

FIG. 10 shows a block diagram illustrating a configuration of a computing system 1200 in accordance with an embodiment of the present disclosure.

Referring to FIG. 10, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 9, the memory system 1210 may be configured with a memory device 1212 and a memory controller 1211.

In accordance with embodiments of the present disclosure, a channel pattern may include a first terminal coupled to a well structure, and a second terminal coupled to a source line. Thereby, embodiments of the present disclosure may separately perform an operation of controlling the flow of current in a channel pattern through the source line, and an operation of supplying, through the well structure, holes for an erase operation. Hence, the operational reliability of the semiconductor device may be improved.

In accordance with embodiments of the present disclosure, openings may be used to couple the well structure and the source line to different terminals of the channel pattern. Therefore, a process of manufacturing the semiconductor device may be simplified.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a source line formed over a substrate;
a channel pattern including a connection part disposed over the source line, and pillar parts protruding from the connection part in a first direction;
a well structure protruding from the connection part in the first direction and spaced apart from the source line;
a source contact structure protruding from the source line in the first direction and passing through the connection part; and
a gate stack disposed between the source contact structure and the well structure and enclosing the pillar parts over the connection part.

2. The semiconductor device according to claim 1, wherein the well structure and the source contact structure extend in a second direction intersecting with the first direction.

3. The semiconductor device according to claim 1, further comprising insulating spacers disposed between the gate stack and the well structure and between the gate stack and the source contact structure,
wherein the well structure and the source contact structure protrude toward the source line further than the insulating spacers.

4. The semiconductor device according to claim 3, wherein the source contact structure comprises a horizontal extension part protruding sideways toward the connection part of the channel pattern and overlapping the corresponding insulating spacer.

5. The semiconductor device according to claim 1, wherein:
the source line includes a first conductivity type dopant; and
at least a portion of the well structure that comes into contact with the connection part of the channel pattern includes a second conductivity type dopant different from the first conductivity type dopant.

6. The semiconductor device according to claim 5, wherein:
the first conductivity type dopant is an n-type dopant; and
the second conductivity type dopant is a p-type dopant.

7. The semiconductor device according to claim 1, wherein:
the source contact structure comprises: a source contact layer extending from the source line in the first direction and formed lower than the gate stack; and a metal layer coupled to the source contact layer;
the source contact layer includes an undoped area and a dummy contact area;
the dummy contact area is defined as an area in which a second conductivity type dopant is distributed in an upper end of the source contact layer; and
the metal layer comes into contact with the dummy contact area and extends in the first direction.

8. The semiconductor device according to claim 7, wherein:
the source contact layer includes a lower end coming into contact with the source line and the connection part of the channel pattern;
a first conductivity type dopant is distributed in the source line and the lower end of the source contact layer; and
the undoped area remains between the lower end of the source contact layer and the dummy contact area.

9. The semiconductor device according to claim 1, wherein the well structure comprises:
a well doping layer coming into contact with the connection part of the channel pattern and extending in the first direction, the well doping layer being formed lower than the gate stack and including a second conductivity type dopant at a first concentration;
an ohmic contact area defined in an upper end of the well doping layer and including the second conductivity type dopant at a second concentration higher than the first concentration; and
a metal layer coming into contact with the ohmic contact area and extending in the first direction.

10. The semiconductor device according to claim 9, wherein the well structure further comprises an undoped semiconductor layer enclosed by the well doping layer.

11. The semiconductor device according to claim 1, further comprising a discharge transistor disposed between the substrate and the source line and coupled to the source line to determine whether to discharge a voltage of the source line.

12. The semiconductor device according to claim 1, further comprising:
   bit lines coupled to the pillar parts of the channel pattern; and
   a well pick-up line coupled to the well structure to supply a well voltage to the well structure.

13. The semiconductor device according to claim 12, wherein the well pick-up line and the bit lines are disposed on a plane perpendicular to the first direction.

14. The semiconductor device according to claim 12, further comprising a source dummy line coupled to the source contact structure and formed of a metal layer,
   wherein the source dummy line and the well pick-up line are disposed on the plane perpendicular to the first direction.

15. A semiconductor device comprising:
   a gate stack disposed over a source line;
   a source contact structure disposed on a sidewall of the gate stack and extending in a first direction so that the source contact structure is coupled to the source line;
   an insulating spacer disposed between the gate stack and the source contact structure;
   a gap-fill insulating pattern passing through the gate stack and extending along a bottom of the gate stack toward the source contact structure to fill a space between the gate stack and the source line; and
   horizontal extension parts protruding from a sidewall of the source contact structure between the insulating spacer and the source line, wherein the horizontal extension parts are spaced from each other in the first direction by a portion of the gap-fill insulating pattern disposed between the gate stack and the source line.

16. The semiconductor device according to claim 15, further comprising
   a channel pattern extending from a space between the gap-fill insulating pattern and the gate stack into a space between the gap-fill insulating pattern and the source line, the channel pattern being coupled to the horizontal extension parts; and
   a multilayer memory layer extending from a space between the channel pattern and the gate stack into a space between the channel pattern and the source line.

17. The semiconductor device according to claim 16, wherein the multilayer memory layer protrudes toward the source contact structure further than the channel pattern, and extends onto the horizontal extension parts.

18. The semiconductor device according to claim 15, wherein the horizontal extension parts extend to overlap the gate stack.

19. The semiconductor device according to claim 15, further comprising a well structure facing the source contact structure with the gate stack interposed between the well structure and the source contact structure, the well structure being shorter than the source contact structure so that the well structure is spaced apart from the source line.

20. The semiconductor device according to claim 19, wherein the source line and the well structure respectively include dopants of different conductivity types.

* * * * *